United States Patent
Akamine et al.

(10) Patent No.: US 9,576,665 B2
(45) Date of Patent: Feb. 21, 2017

(54) SEMICONDUCTOR MEMORY DEVICE AND MEMORY SYSTEM

(71) Applicant: Kabushiki Kaisha Toshiba, Minato-ku (JP)

(72) Inventors: Takayuki Akamine, Yokohama (JP); Masanobu Shirakawa, Chigasaki (JP); Hiroshi Sukegawa, Tokyo (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/847,086

(22) Filed: Sep. 8, 2015

(65) Prior Publication Data

US 2016/0267980 A1 Sep. 15, 2016

Related U.S. Application Data

(60) Provisional application No. 62/132,216, filed on Mar. 12, 2015.

(51) Int. Cl.
*G11C 16/04* (2006.01)
*G11C 16/10* (2006.01)
*G11C 29/02* (2006.01)

(52) U.S. Cl.
CPC .......... *G11C 16/0483* (2013.01); *G11C 16/10* (2013.01); *G11C 29/025* (2013.01)

(58) Field of Classification Search
USPC ................................................... 365/185.17
See application file for complete search history.

(56) References Cited

U.S. PATENT DOCUMENTS

| 6,307,778 | B1* | 10/2001 | Micheloni | G11C 29/02 365/185.09 |
| 9,007,826 | B2* | 4/2015 | Fujiu | G11C 16/3459 365/185.03 |
| 2003/0234408 | A1 | 12/2003 | Tanaka | |
| 2005/0083735 | A1 | 4/2005 | Chen et al. | |
| 2006/0227624 | A1* | 10/2006 | Shiga | G11C 11/5628 365/210.12 |
| 2008/0106946 | A1* | 5/2008 | Inoue | G11C 11/5628 365/185.22 |
| 2009/0267128 | A1 | 10/2009 | Maejima | |
| 2009/0268522 | A1 | 10/2009 | Maejima | |
| 2010/0061151 | A1 | 3/2010 | Miwa et al. | |
| 2010/0207195 | A1 | 8/2010 | Fukuzumi et al. | |
| 2010/0214838 | A1 | 8/2010 | Hishida et al. | |

(Continued)

FOREIGN PATENT DOCUMENTS

| JP | 2012-502408 | 1/2012 |
| JP | 2013-69392 | 4/2013 |
| JP | 2013-254537 | 12/2013 |

*Primary Examiner* — Hoai V Ho
*Assistant Examiner* — Minh Dinh
(74) *Attorney, Agent, or Firm* — Oblon, McClelland, Maier & Neustadt, L.L.P.

(57) ABSTRACT

A semiconductor memory device includes: a first string unit including first and second memory cell transistors; a second string unit including third and fourth memory cell transistors; a first word line coupled to gates of the first and third memory cell transistors; and a second word line coupled to gates of the second and fourth memory cell transistors. When the first string unit is selected and the first word line is selected, a first voltage is applied. The first voltage is larger than an initial value of the voltage in the step-up operation.

20 Claims, 22 Drawing Sheets

(56) References Cited

U.S. PATENT DOCUMENTS

| | | |
|---|---|---|
| 2011/0284946 A1 | 11/2011 | Kiyotoshi |
| 2012/0069663 A1 | 3/2012 | Itagaki et al. |
| 2012/0307557 A1 | 12/2012 | Itagaki |
| 2013/0077402 A1 | 3/2013 | Izumi |
| 2013/0193944 A1 | 8/2013 | Suzuki |
| 2013/0332659 A1 | 12/2013 | Maejima |
| 2014/0063949 A1* | 3/2014 | Tokiwa ............... G11C 16/16 365/185.11 |

* cited by examiner

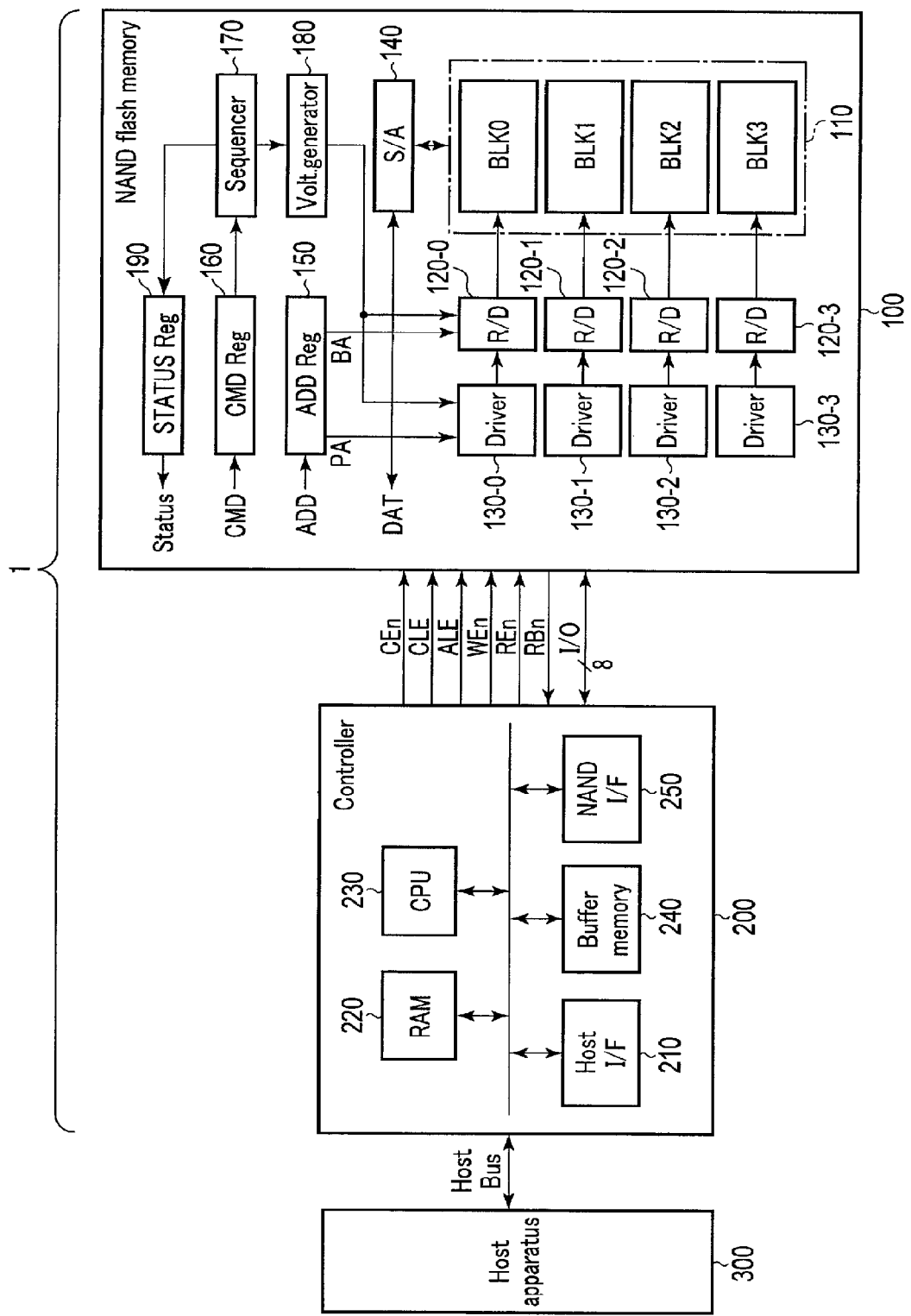
F I G. 1

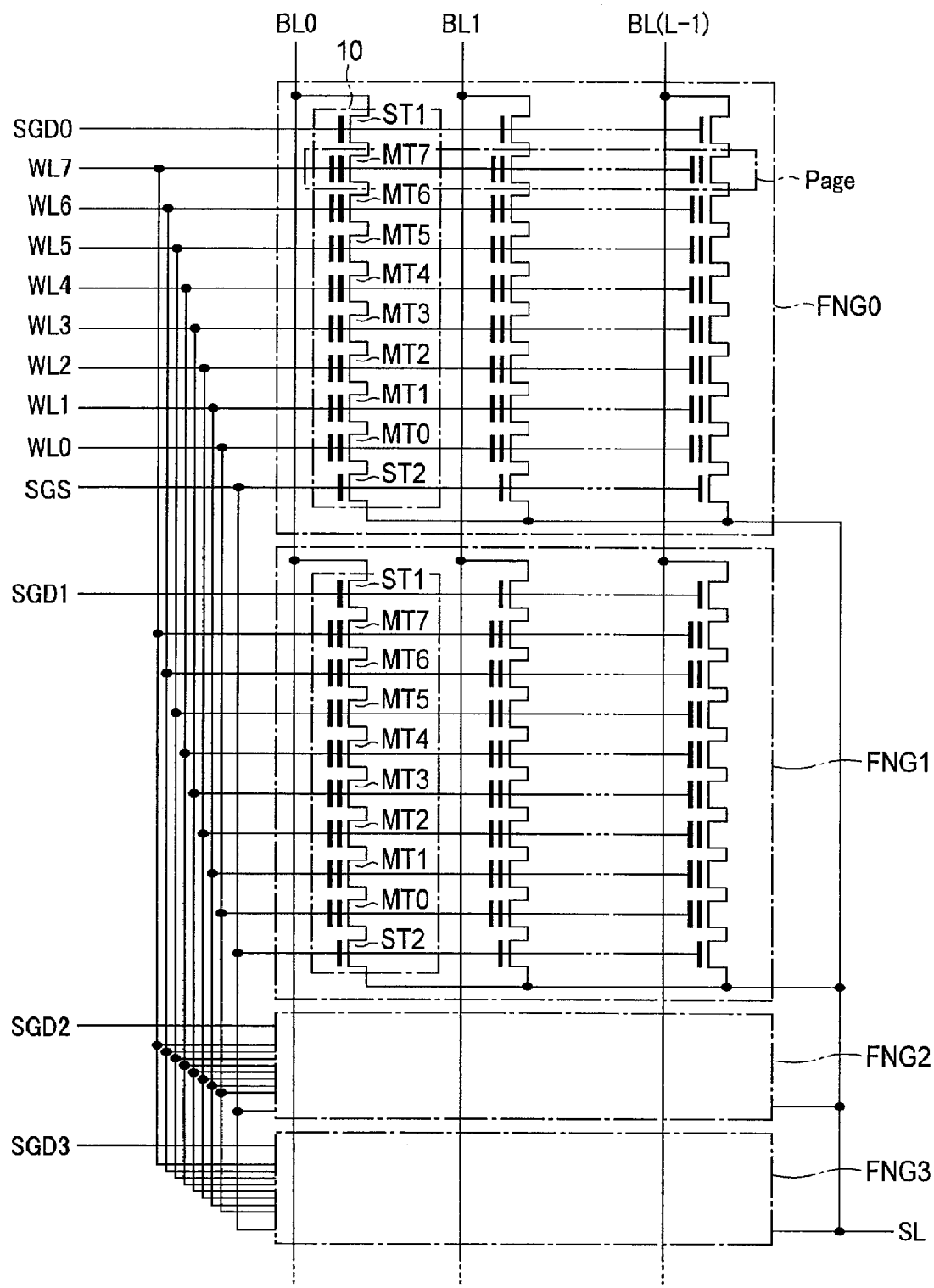
F I G. 2

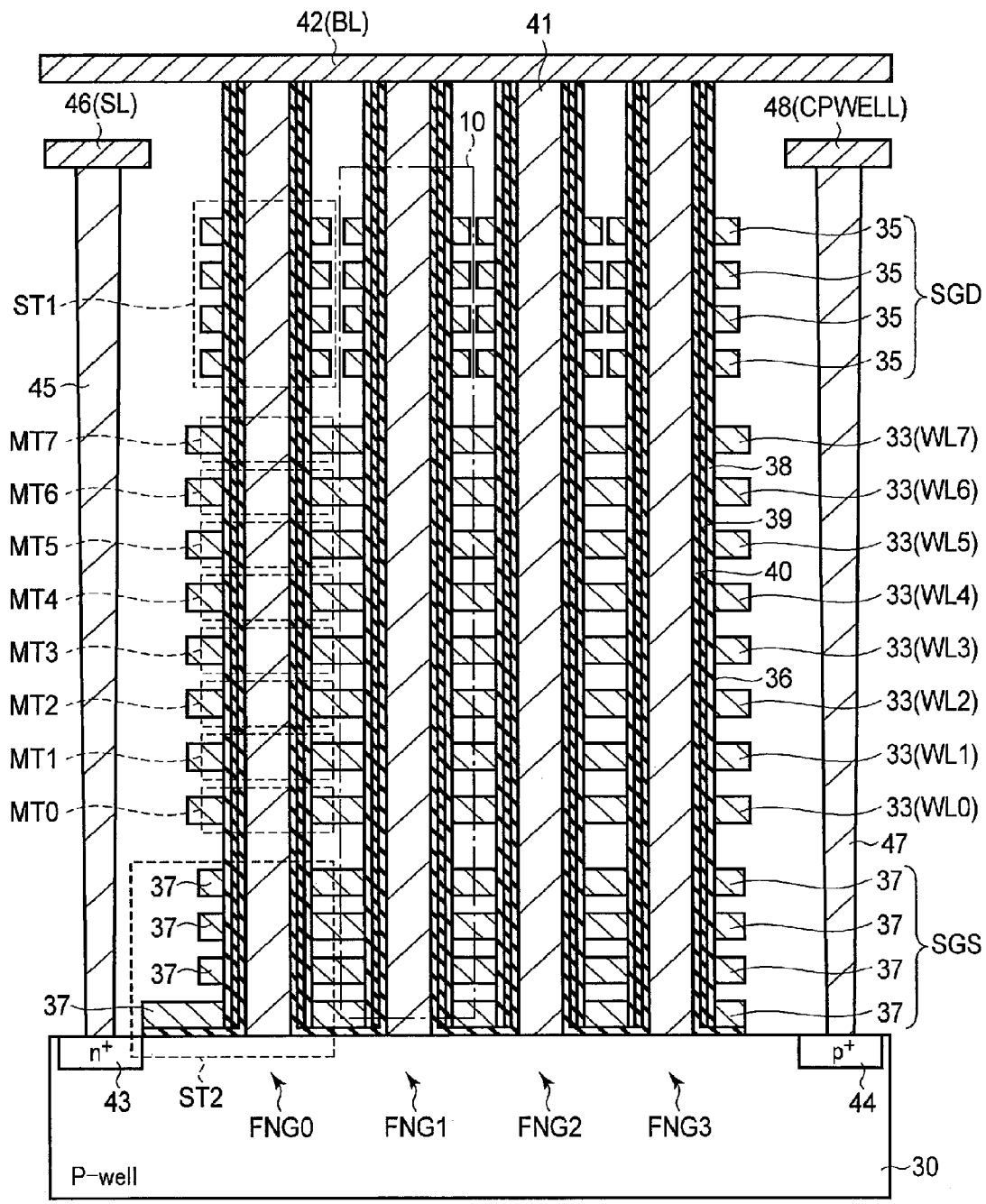
F I G. 3

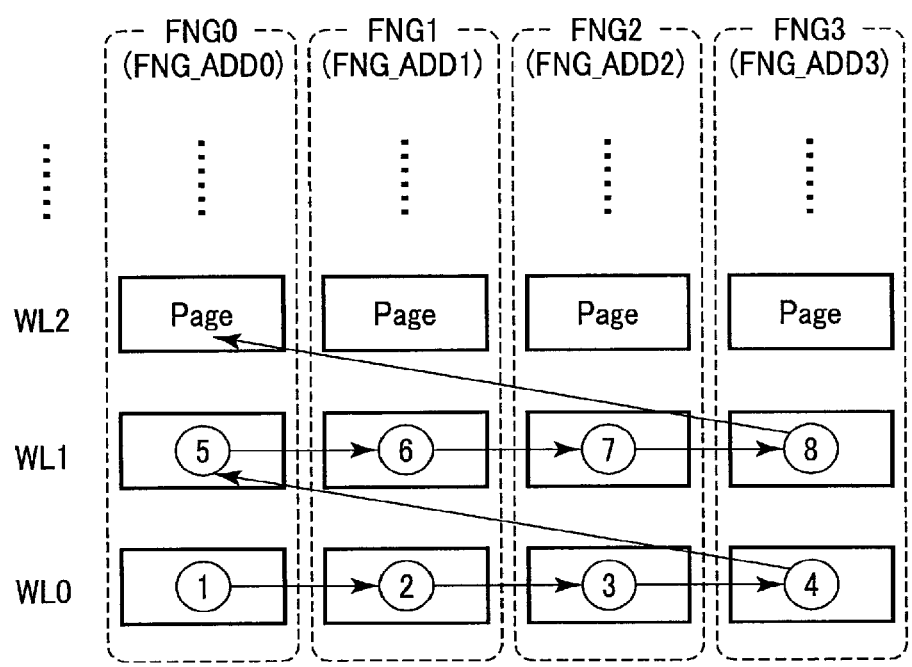
F I G. 4

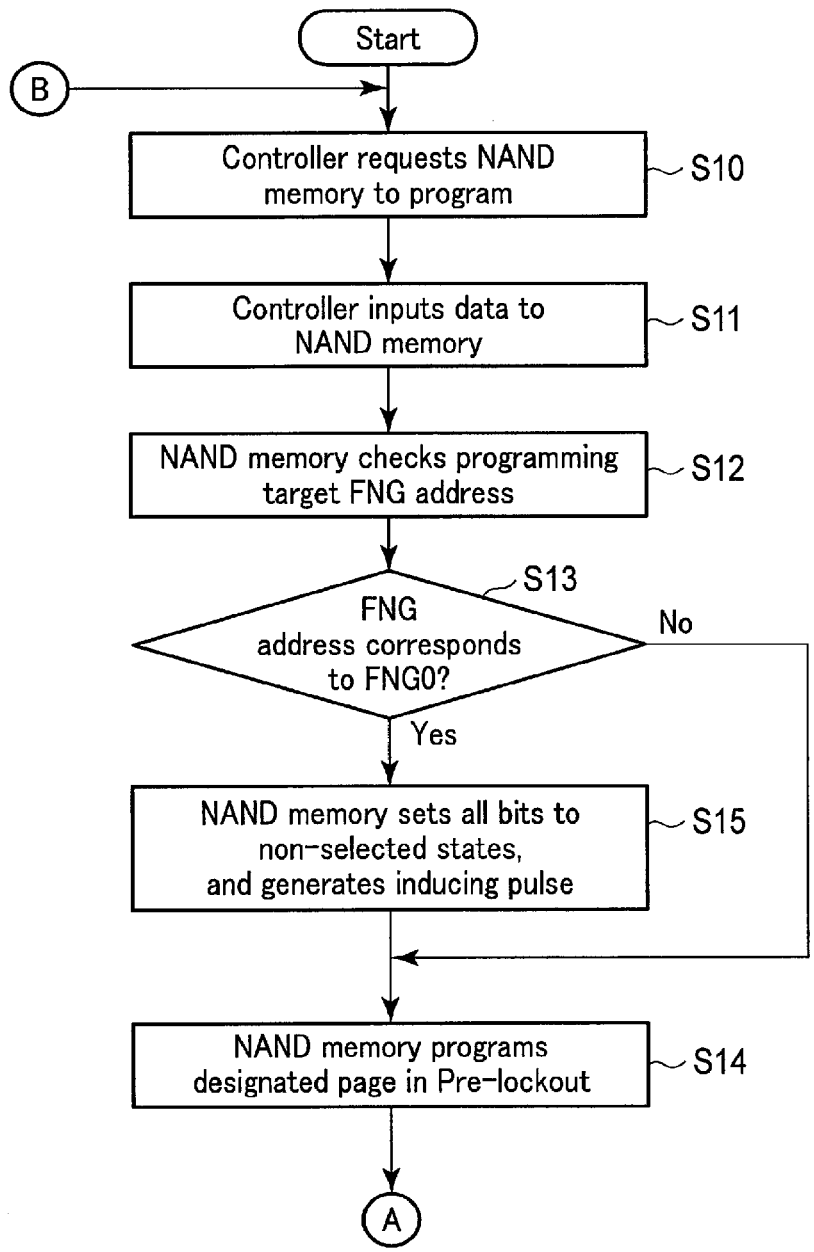
F I G. 5A

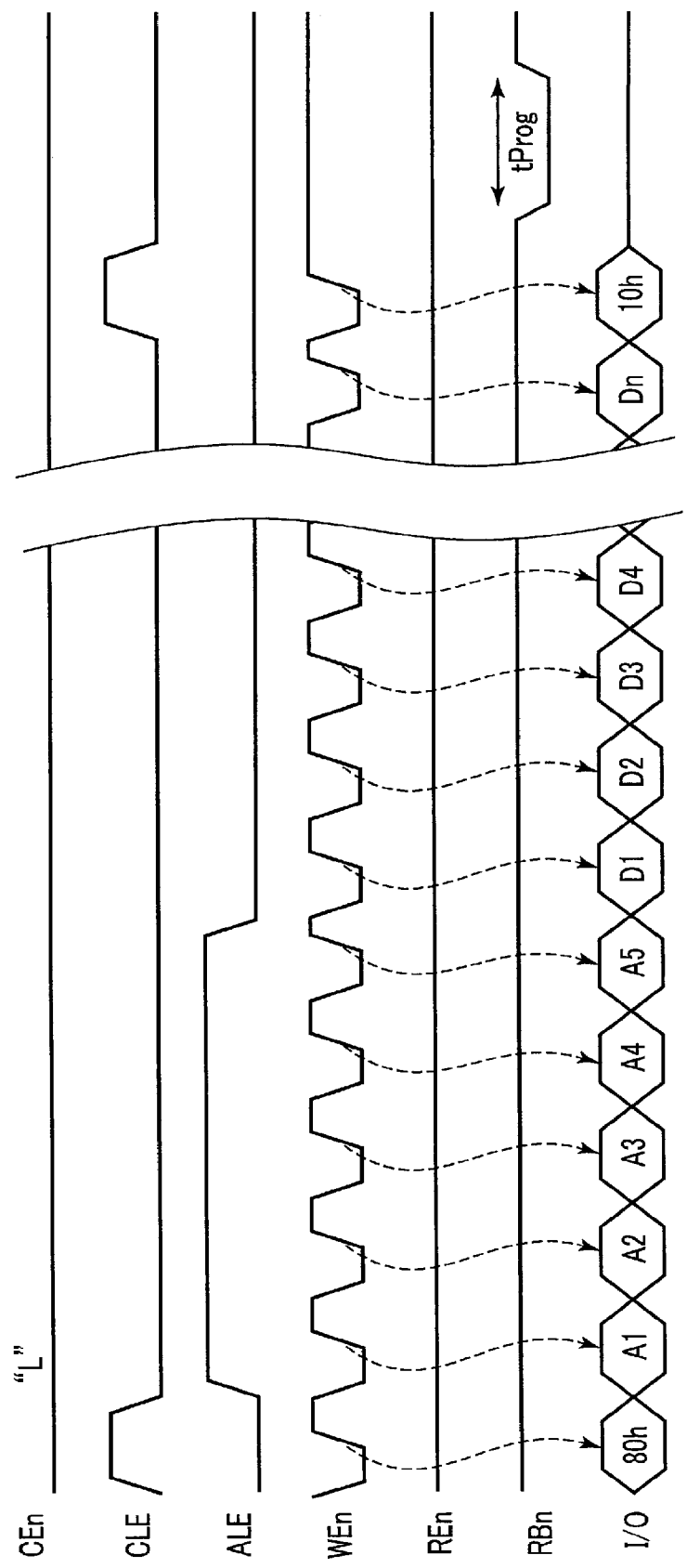
F I G. 6

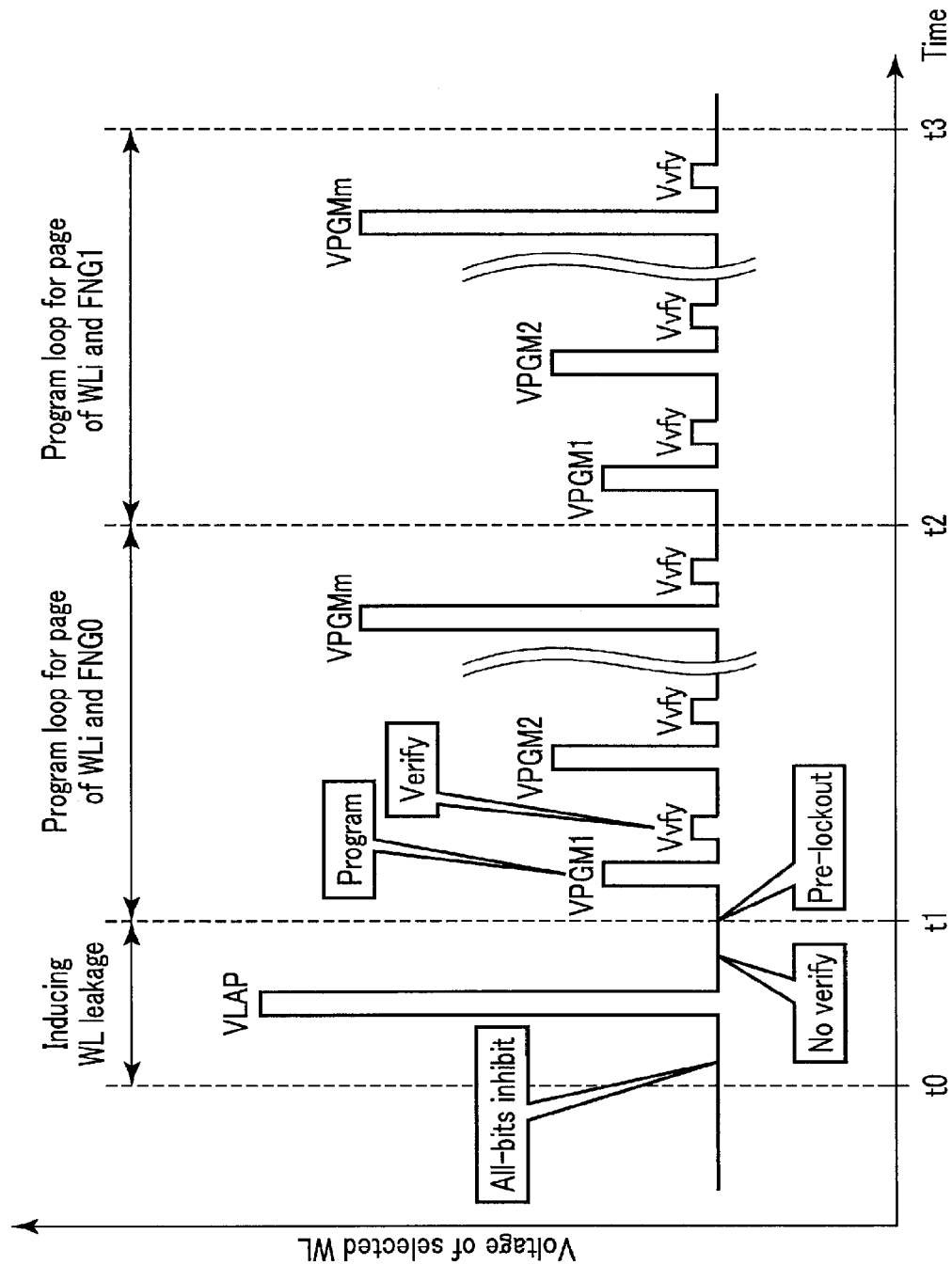
F I G. 7

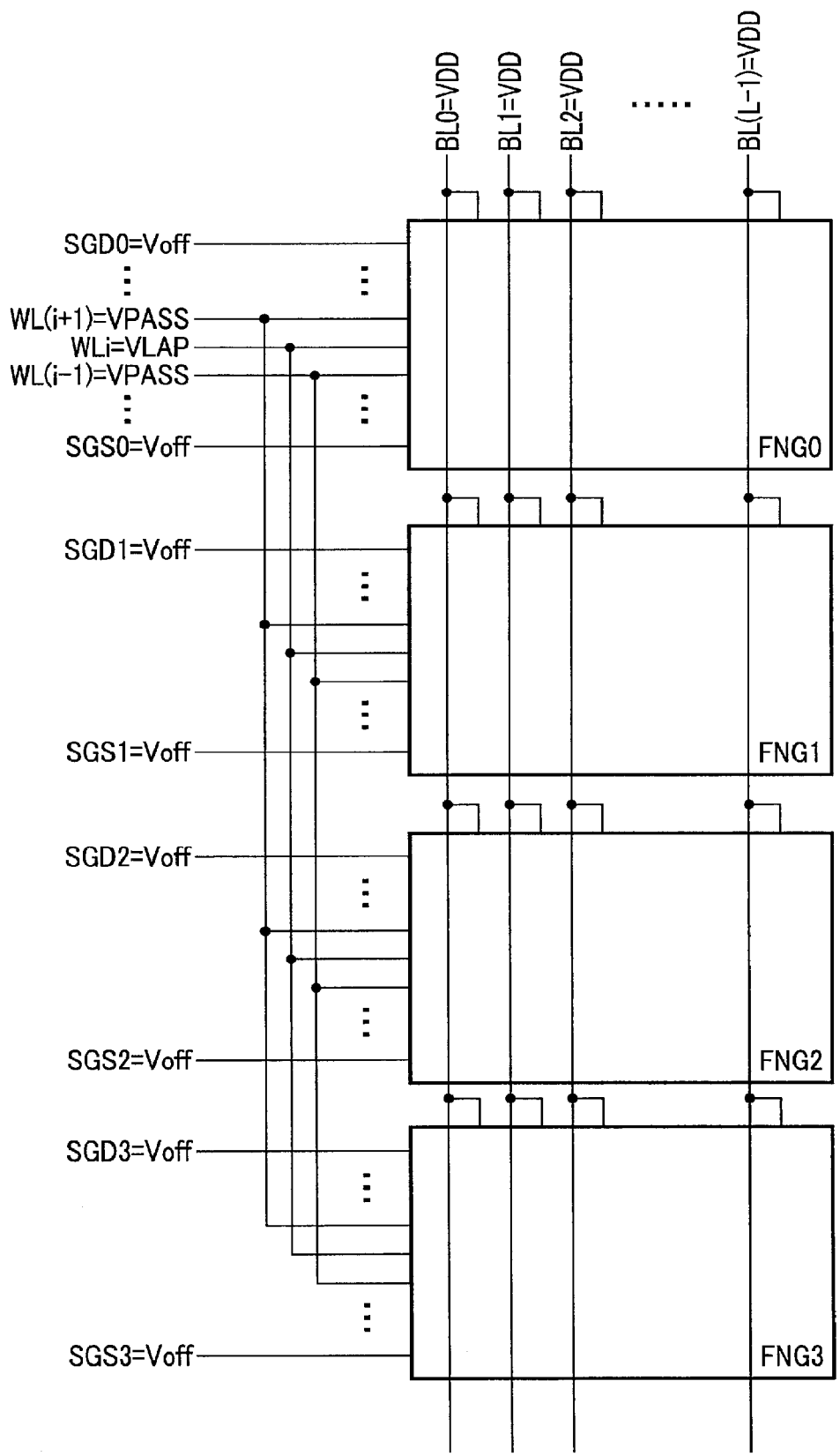
F I G. 8

| | Status | Output |
|---|---|---|
| I/O[0] | Current status | Pass: "0", fail: "1" |
| I/O[1] | Prevous status | Pass: "0", fail: "1" |
| I/O[2] | Not used | "0" |
| I/O[3] | Not used | "0" |
| I/O[4] | Not used | "0" |
| I/O[5] | True busy | Ready: "0", busy: "1" |
| I/O[6] | Cache busy | Ready: "0", busy: "1" |
| I/O[7] | Write protect | Protect: "0", not protect: "1" |

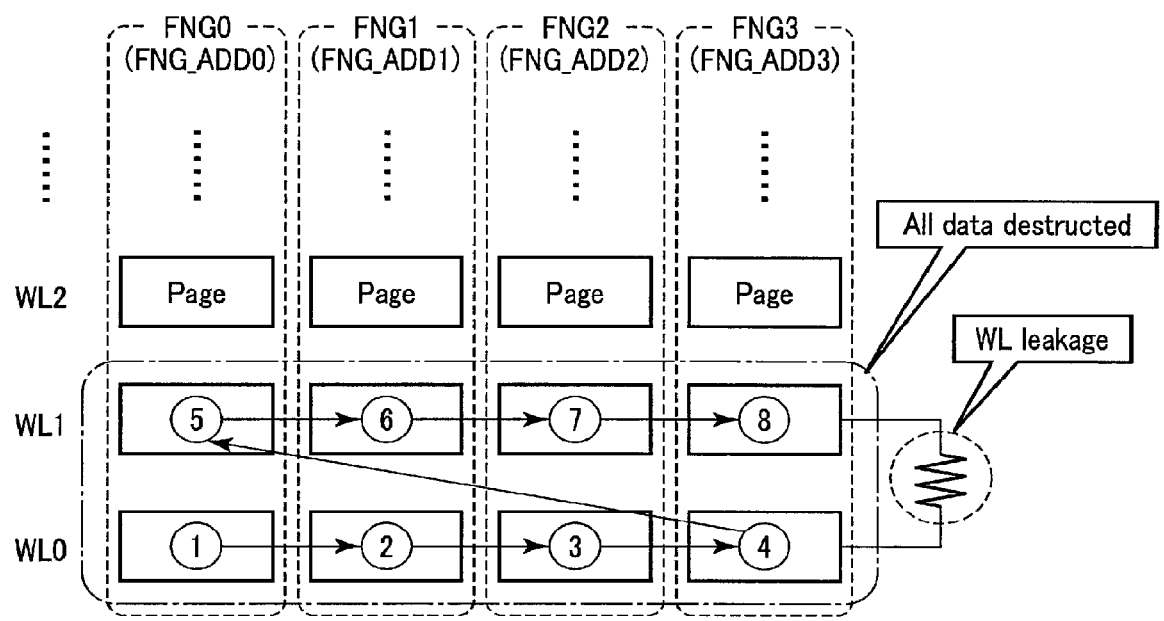
F I G. 11

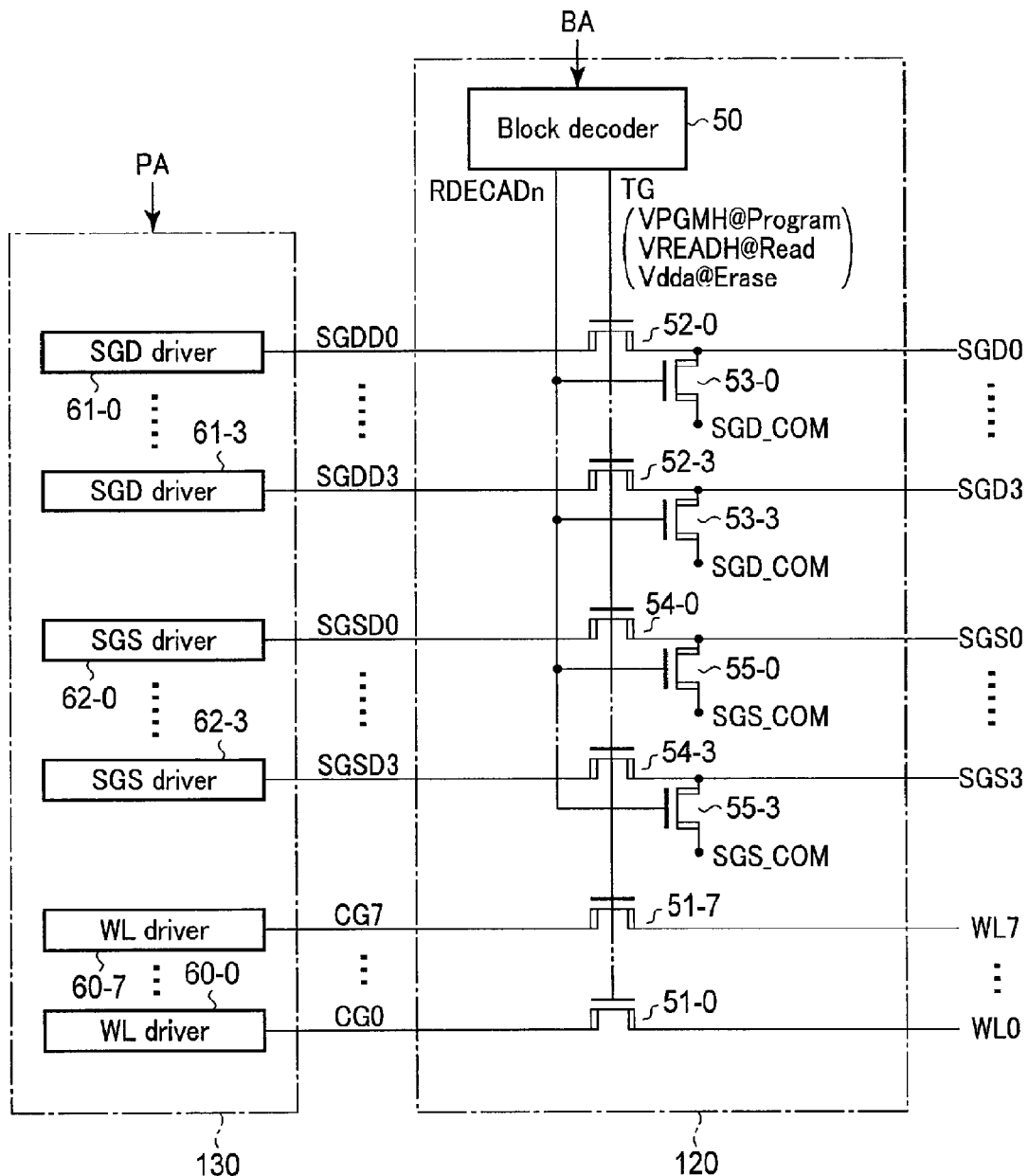
F I G. 12

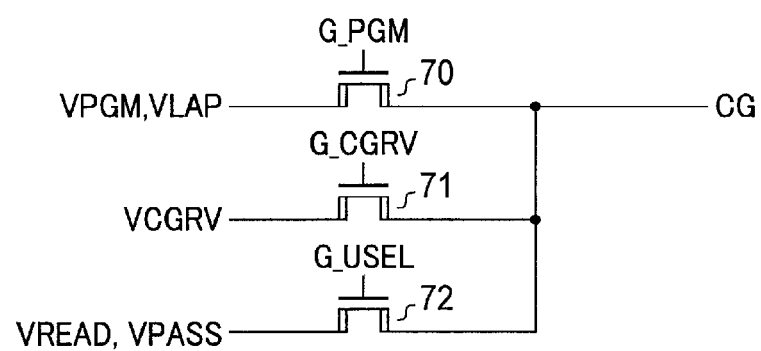
F I G. 13

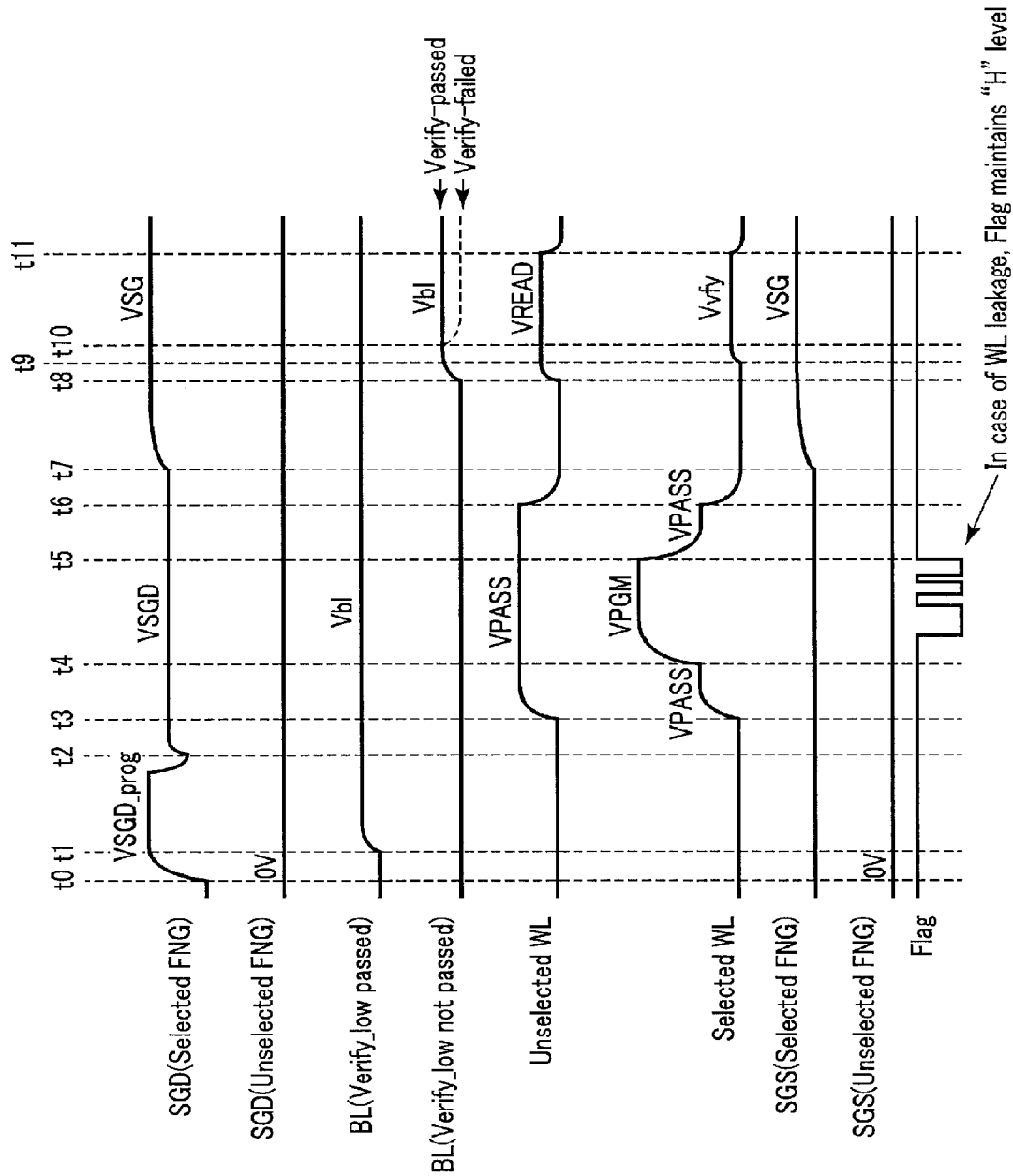
F I G. 15

| | Status | Output |
|---|---|---|
| I/O[0] | Current status | Pass: "0", fail: "1" |
| I/O[1] | Prevous status | Pass: "0", fail: "1" |
| I/O[2] | WL short | Good: "0", burst: "1" |
| I/O[3] | Not used | "0" |
| I/O[4] | Not used | "0" |
| I/O[5] | True busy | Ready: "0", busy: "1" |
| I/O[6] | Cache busy | Ready: "0", busy: "1" |
| I/O[7] | Write protect | Protect: "0", not protect: "1" |

| WL address | Pulse applied? | Status result |
|---|---|---|
| WL0 | Yes | Failed |
| WL1 | Yes | Failed |
| WL2 | Yes | Passed |
| WL3 | No | – |
| ⋮ | ⋮ | ⋮ |

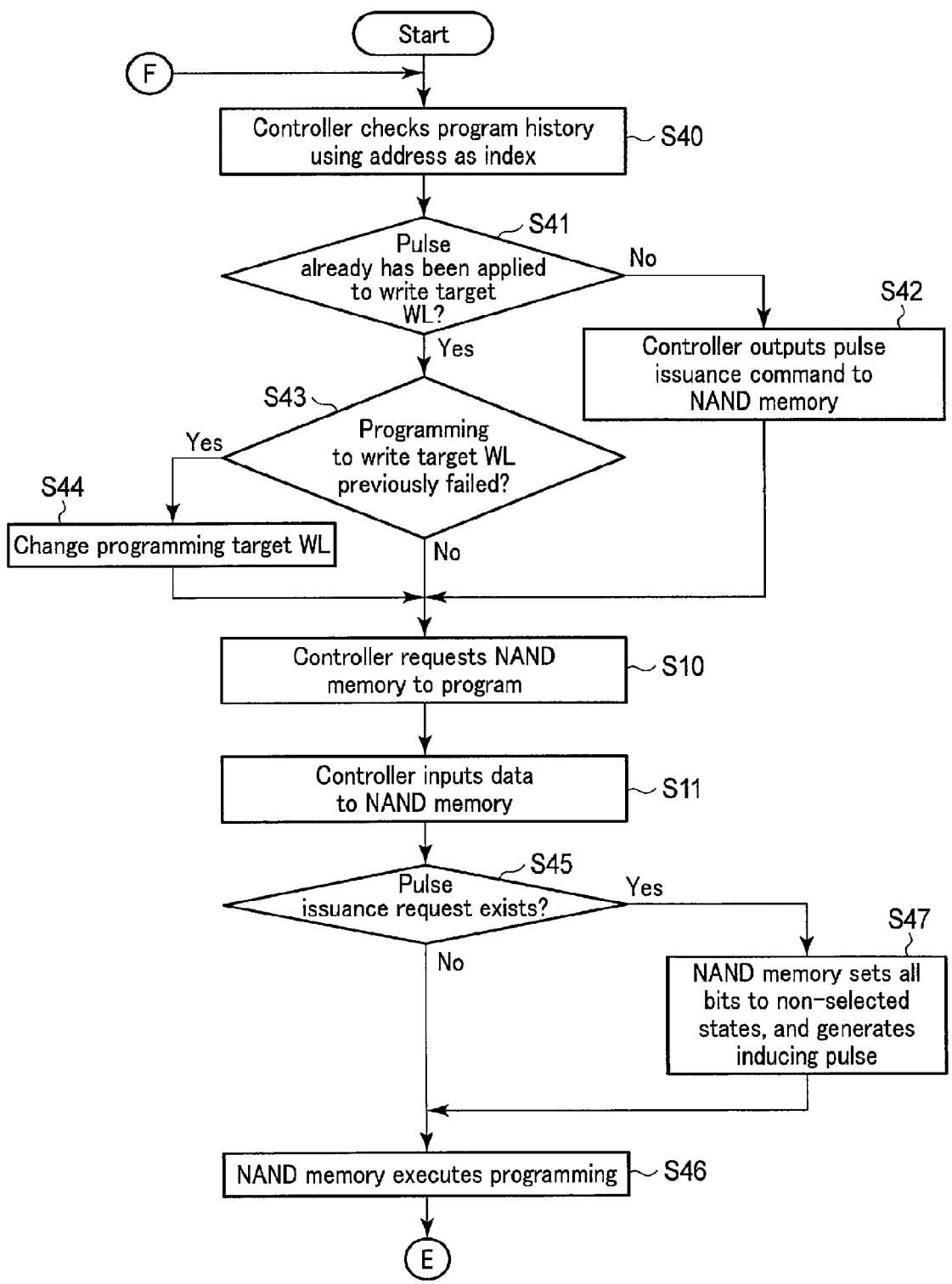
F I G. 19A

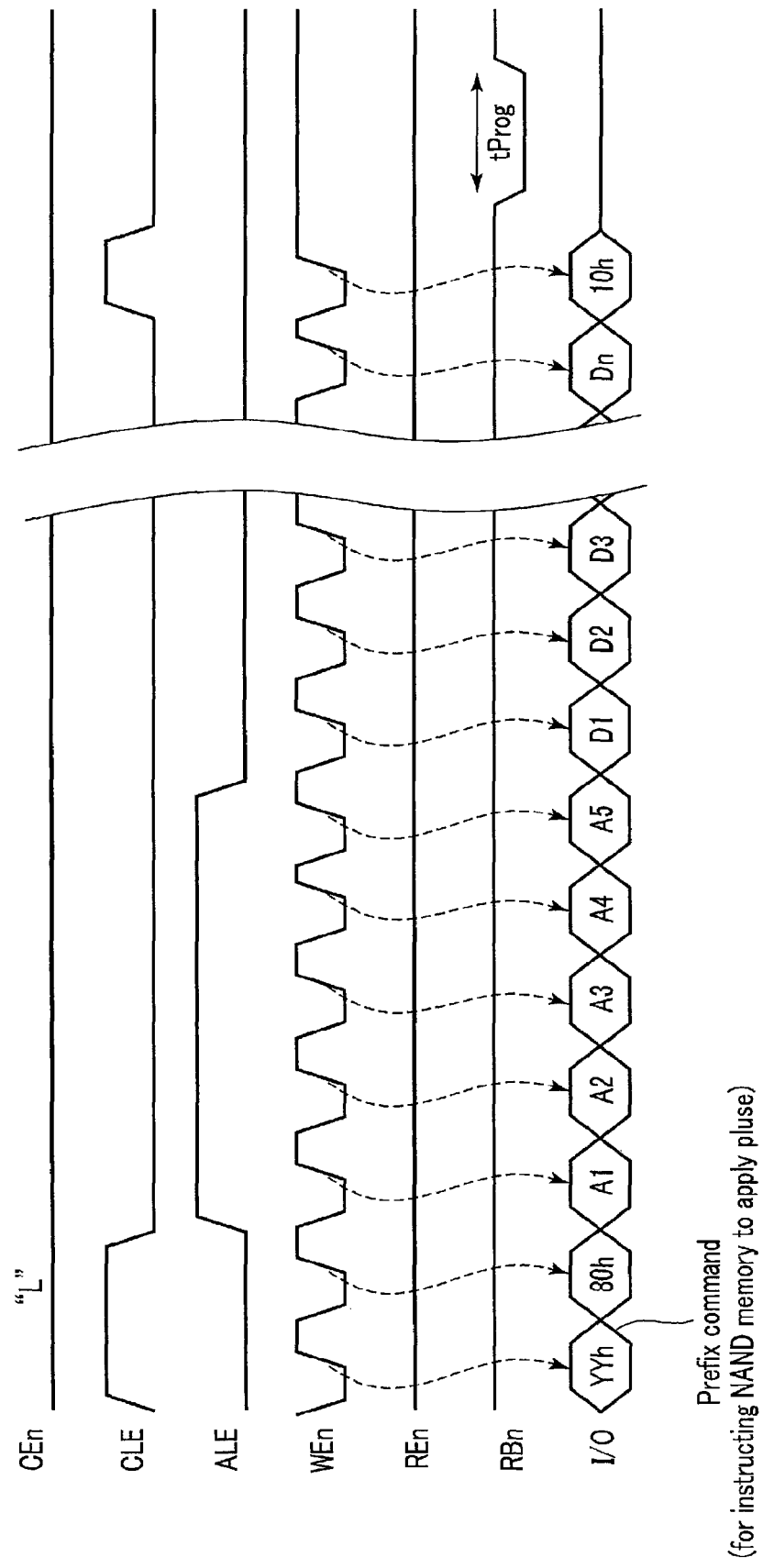
F I G. 20

SEMICONDUCTOR MEMORY DEVICE AND MEMORY SYSTEM

CROSS-REFERENCE TO RELATED APPLICATIONS

This application claims the benefit of U.S. Provisional Application No. 62/132,216, filed Mar. 12, 2015, the entire contents of which are incorporated herein by reference.

FIELD

Embodiments described herein relate generally to a semiconductor memory device and a memory system.

BACKGROUND

A NAND flash memory is known in which memory cells are three-dimensionally arranged.

BRIEF DESCRIPTION OF THE DRAWINGS

FIG. 1 is a block diagram of a memory system according to a first embodiment;

FIGS. 2 and 3 are a circuit diagram and a sectional view of a memory cell array according to the first embodiment;

FIG. 4 is a schematic view of a memory according to the first embodiment;

FIGS. 5A and 5B are flowcharts of a data writing method according to the first embodiment;

FIG. 6 illustrates a command sequence in data writing according to the first embodiment;

FIG. 7 is a timing chart of a word line voltage in data writing according to the first embodiment;

FIG. 8 is a schematic view of a block in applying of an inducing voltage according to the first embodiment;

FIG. 11 is a schematic view of a memory;

FIG. 12 is a circuit diagram of a row decoder and a driver circuit according to a second embodiment;

FIG. 13 is a circuit diagram of a WL driver according to the second embodiment;

FIG. 15 is a timing chart of voltages of various interconnects in data writing according to the second embodiment;

FIGS. 19A and 19B are flowcharts of a data writing method according to the third embodiment;

FIG. 20 illustrates a command sequence in data writing according to the third embodiment.

DETAILED DESCRIPTION

Figure 5B:
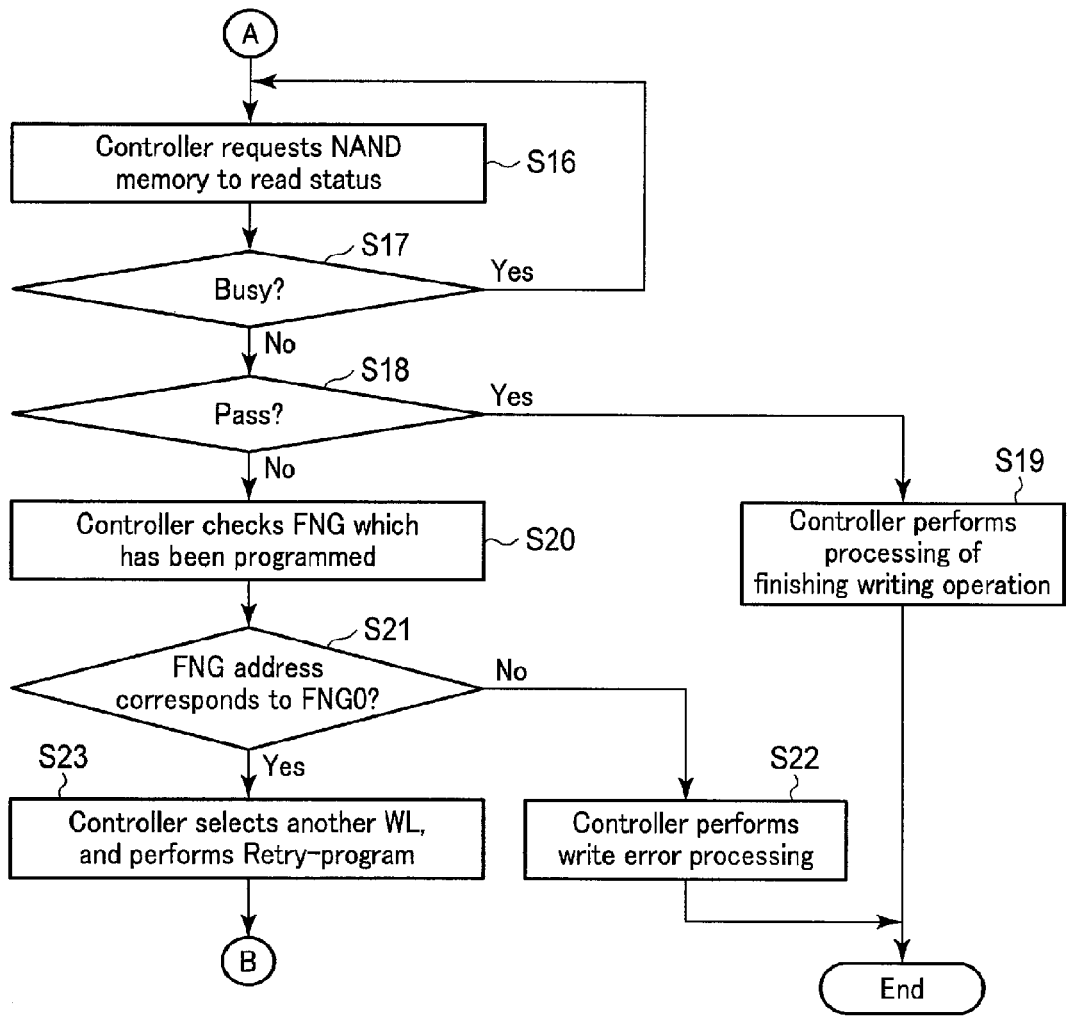

In general, according to one embodiment, a semiconductor memory device includes: a first string unit including first and second memory cell transistors; a second string unit including third and fourth memory cell transistors; a first word line coupled to gates of the first and third memory cell transistors; and a second word line coupled to gates of the second and fourth memory cell transistors. A data writing operation includes a step-up operation of a voltage of a word line. When the first string unit is selected and the first word line is selected, a first voltage is applied to the first word line before the step-up operation. The first voltage is larger than an initial value of the voltage in the step-up operation.

1. First Embodiment

A semiconductor memory device and a memory system according to the first embodiment will be described. A three-dimensionally stacked NAND flash memory formed by three-dimensionally stacking memory cells above a semiconductor substrate will be described below as an example of the semiconductor memory device.

1.1 Configuration

1.1.1 Entire Configuration of Memory System

First, a rough entire configuration of the memory system including a semiconductor memory device according to the present embodiment will be described with reference to FIG. 1. FIG. 1 is a block diagram of the memory system according to the present embodiment.

As illustrated in FIG. 1, a memory system 1 includes a NAND flash memory 100 and a controller 200. The NAND flash memory 100 and the controller 200 may be, for example, combined to form one semiconductor device, and an example of the combination is a memory card such as an SD™ card or an SSD (solid state drive).

The NAND flash memory 100 includes a plurality of memory cells, and stores data in a non-volatile manner. The controller 200 is connected to the NAND flash memory 100 through a NAND bus, and is connected to a host apparatus 300 through a host bus. Further, the controller 200 controls the NAND flash memory 100, and accesses the NAND flash memory 100 in response to a command received from the host apparatus 300. The host apparatus 300 is, for example, a digital camera or a personal computer, and the host bus is a bus which complies with, for example, an SD™ interface.

The NAND bus transmits and receives signals which comply with a NAND interface. A specific example of these signals includes a chip enable signal CEn, an address latch enable signal ALE, a command latch enable signal CLE, a write enable signal WEn, a read enable signal REn, a ready/busy signal RBn and an input/output signal I/O.

The signal CEn is a signal to enable the NAND flash memory 100, and is asserted at a low level. The signals CLE and ALE are signals to notify the NAND flash memory 100 that the input signals I/O to the NAND flash memory 100 are a command and an address, respectively. The signal WEn is asserted at a low level, and is a signal to cause the NAND flash memory 100 to take in the input signal I/O. The signal REn is also asserted at a low level, and is a signal to read the output signal I/O from the NAND flash memory 100. The ready/busy signal RPn is a signal indicating whether the NAND flash memory 100 is in a ready state (a state where the NAND flash memory 100 can receive a command from the controller 200) or a busy state (a state where the NAND flash memory 100 cannot receive the command from the controller 200), and a low level indicates the busy state. The input/output signal I/O is, for example, an 8-bit signal. Further, the input/output signal I/O is an entity of data to be transmitted and received between the NAND flash memory 100 and the controller 200, and is, for example, a command, an address, write data and read data.

1.1.2 Configuration of Controller 200

Next, the configuration of the controller 200 will be described in detail with reference to FIG. 1. As illustrated in FIG. 1, the controller 200 includes a host interface 210, an embedded memory (RAM) 220, a processor (CPU) 230, a buffer memory 240 and a NAND interface 250.

The host interface 210 is coupled to the host apparatus 300 through the host bus, and transfers a command and data received from the host apparatus 300 to the processor 230 and the buffer memory 240. Further, the host interface 210 transfers data in the buffer memory 240 to the host apparatus 300 in response to the command of the processor 230.

The processor 230 controls an entire operation of the controller 200. When, for example, receiving a write access from the host apparatus 300, the processor 230 issues a write command to the NAND interface 250 in response to the write access. The same also applies when reading and erasing are performed. Further, the processor 230 executes various types of processing such as wear leveling for managing the NAND flash memory 100. Further, the processor 230 performs error correction processing. More specifically, in data writing, the processor 230 generates a parity based on write data, and outputs net write data and the parity to the NAND flash memory 100. On the other hand, in data reading, the processor 230 generates a syndrome based on the read parity, and detects and corrects an error based on the syndrome. In addition, the error correction processing may be performed by hardware (ECC circuit) provided in addition to the processor 230.

The NAND interface 250 is coupled to the NAND flash memory 100 through the NAND bus, and controls communication with the NAND flash memory 100. Further, the NAND interface 250 outputs the signals CEn, ALE, CLE, WEn and REn to the NAND flash memory 100 based on the command received from the CPU 230. Further, in writing, the NAND interface 250 transfers the write command issued by the processor 230 and write data in the buffer memory 240 as the input/output signals I/O to the NAND flash memory 100. Furthermore, in reading, the NAND interface 250 transfers the read command issued by the processor 230 as the input/output signal I/O to the NAND flash memory 100, receives the data read from the NAND flash memory 100 as the input/output signal I/O and transfers the input/output signal I/O to the buffer memory 240.

The buffer memory 240 temporarily holds the write data and the read data.

The embedded memory 220 is a semiconductor memory such as a DRAM, and is used as a working area of the processor 230. Further, the embedded memory 220 holds firmware for managing the NAND flash memory 100, and various management tables.

1.1.3 Configuration of NAND Flash Memory 100

1.1.3.1 Entire Configuration of NAND Flash Memory 100

Next, the configuration of the NAND flash memory 100 will be described. As illustrated in FIG. 1, the NAND flash memory 100 includes a memory cell array 110, row decoders 120 (120-0 to 120-3), driver circuits 130 (130-0 to 130-3), a sense amplifier 140, an address register 150, a command register 160, a status register 190, a sequencer 170 and a voltage generator circuit 180.

The memory cell array 110 includes, for example, four blocks BLKs (BLK0 to BLK3) which is a group of a plurality of non-volatile memory cells associated with rows and columns. Further, the memory cell array 110 stores data given from the controller 200.

The row decoders 120-0 to 120-3 are provided by being associated with the blocks BLK0 to BLK3, respectively, and select a row direction of the corresponding block BLK.

The driver circuits 130-0 to 130-3 are provided by being associated with the row decoders 120-0 to 120-3, respectively, and output voltages to the blocks BLK0 to BLK3 through the corresponding row decoders 120-0 to 120-3.

In data reading, the sense amplifier 140 senses data read from the memory cell array 110, and outputs this data DAT to the controller 200. In data writing, the sense amplifier 140 transfers the write data DAT received from the controller 200 to the memory cell array 110.

The address register 150 holds an address ADD received from the controller 200. The command register 160 holds a command CMD received from the controller 200. The status register 190 holds various statuses of the NAND flash memory 100 according to a command of the sequencer 170.

The sequencer 170 controls the entire operation of the NAND flash memory 100 based on the command CMD held in the command register 160.

The voltage generator circuit 180 generates a necessary voltage based on the command of the sequencer 170, and outputs the voltage to, for example, the row decoders 120, the driver circuits 130 and the sense amplifier 140.

1.1.2.3 Configuration of Block BLK

Next, the configuration of the block BLK will be described with reference to FIG. 2. FIG. 2 is a circuit diagram of the block BLK.

As illustrated in FIG. 2, the block BLK includes, for example, four fingers FNG (FNG0 to FNG3). Further, each finger FNG includes a plurality of NAND strings 10.

Each NAND string 10 includes, for example, eight memory cell transistors MT (MT0 to MT7) and selection transistors ST1 and ST2. The memory cell transistor MT includes a control gate and a charge storage layer, and holds data in a non-volatile manner. Further, the memory cell transistor MT is connected in series between a source of the selection transistor ST1 and a drain of the selection transistor ST2.

The gates of the selection transistors ST1 of the fingers FNG0 to FNG3 are connected to selection gate lines SGD0 to SGD3, and the gates of the selection transistors ST2 are commonly connected to a selection gate line SGS. In addition, similarly to the selection transistors ST1, the gates of the selection transistors ST2 may also be connected to selection gate lines SGS0 to SGS3 which are different per finger FNG0 to FNG3. Further, control gates of the memory cell transistors MT0 to MT7 in the same block BLK are commonly connected to word lines WL0 to WL7, respectively.

Further, the drains of the selection transistors ST1 of the NAND strings 10 in the same row in the memory cell array 110 are commonly connected to bit lines BL (BL0 to BL(L−1) where (L−1) is a natural number equal to or more than one). That is, the bit lines BL commonly connect the NAND strings 10 between a plurality of fingers FNG0 to FNG3, and also between the blocks BLK. Further, the sources of a plurality of selection transistors ST2 are commonly connected to a source line SL.

That is, the finger FNG is a group of the NAND strings 10 which are connected to different bit lines, and are connected to a same selection gate line SGD. Further, the block BLK is a group of a plurality of fingers FNG which are commonly connected to a word line WL. Furthermore, the memory cell array 110 is a group of a plurality of blocks BLK which are commonly connected to the bit lines BL.

Data is collectively written in or read from the memory cell transistor MT connected to one of the word lines WL of one of the fingers FNG. This unit is referred to as a "page".

Further, data can be erased in block BLK units or smaller units than the block BLK units. For example, U.S. patent application Ser. No. 13/235,389 filed on Sep. 18, 2011 entitled "NONVOLATILE SEMICONDUCTOR MEMORY DEVICE" discloses an erasing method. Further, U.S. patent application Ser. No. 12/694,690 filed on Jan. 27, 2010 entitled "NON-VOLATILE SEMICONDUCTOR STORAGE DEVICE" also discloses an erasing method. Furthermore, U.S. patent application Ser. No. 13/483,610 filed on May 30, 2012 entitled "NONVOLATILE SEMICONDUCTOR MEMORY DEVICE AND DATA ERASE METHOD THEREOF" also discloses an erasing method. The entire contents of these patent applications are incorporated herein by reference.

FIG. 3 is a sectional view of the block BLK. As illustrated in FIG. 3, a plurality of NAND strings 10 are formed on a p-well region 30. That is, a plurality of interconnect layers 37 which function as the selection gate lines SGS, a plurality of interconnect layers 33 which function as the word lines WL and a plurality of interconnect layers 35 which function as the selection gate lines SGD are formed above the well region 30.

Further, memory holes 36 which reach the well region 30 through the interconnect layers 35, 33 and 37 are made. A block insulating film 38, a charge storage layer 39 (insulating film), and a gate insulating film 40 are sequentially formed on the side surface of the memory hole 36, and the memory hole 36 is further filled with an electrically conductive film 41. The conductive film 41 functions as the current path of the NAND string 10, and is an area where a channel is formed during the operations of the memory cell transistors MT and the selection transistors ST1 and ST2.

The multiple (four in this example) interconnect layers 27 provided in each of the NAND strings 10 are electrically connected in common, and are connected to the same selection gate line SGS. That is to say, the four interconnect layers 27 substantially function as a gate electrode of one selection transistor ST2. The same also applies to the selection transistor ST1 (four selection gate lines SGD).

According to the configuration described above, the selection transistor ST2, the memory cell transistors MT, and the selection transistor ST1 are sequentially stacked on the well region 30 in each of the NAND strings 10.

A interconnect layer 42 which functions as the bit line BL is formed on the conductive film 41. The bit line BL is connected to the sense amplifier 140.

Furthermore, an n$^+$-type impurity diffusion layer 43 and a p$^+$-type impurity diffusion layer 44 are formed in the surface of the well region 30. A contact plug 45 is formed on the diffusion layer 43, and an interconnect layer 46 which functions as the source line SL is formed on the contact plug 45. A contact plug 47 is formed on the diffusion layer 44, and an interconnect layer 48 which functions as a well interconnect line CPWELL is formed on the contact plug 47.

The configurations described above are arrayed in the depth direction of the drawing of FIG. 3, and the finger FNG is formed by a set of the NAND strings 10 arranged in the depth direction.

In addition, the memory cell array 110 may have another configuration. That is. U.S. patent application Ser. No. 12/407,403 filed on Mar. 19, 2009 entitled "THREE DIMENSIONAL STACKED NONVOLATILE SEMICONDUCTOR MEMORY" discloses the configuration of the memory cell array 110. Further, U.S. patent application Ser. No. 12/406,524 filed on Mar. 18, 2009 entitled "THREE DIMENSIONAL STACKED NONVOLATILE SEMICONDUCTOR MEMORY", U.S. patent application Ser. No. 12/679,991 filed on Mar. 25, 2010 entitled "NON-VOLATILE SEMICONDUCTOR STORAGE DEVICE AND METHOD OF MANUFACTURING THE SAME" and U.S. patent application Ser. No. 12/532,030 filed on Mar. 23, 2009 entitled "SEMICONDUCTOR MEMORY AND METHOD FOR MANUFACTURING SAME" disclose configurations of the memory cell array 110. The entire contents of these patent applications are incorporated herein by reference.

1.2 Writing Operation

Next, a data writing method in the memory system according to the present embodiment will be described.

1.2.1 Page Selection Order in Block BLK

First, a page selection order in writing of data will be described with reference to FIG. 4. FIG. 4 schematically illustrates a sectional configuration of the memory cell transistor MT of one given block BLK, and illustrates the word lines WL separated per memory cell transistor MT and does not illustrate the configuration of the memory hole 36 for ease of description.

In the present embodiment, pages allocated to a given word line WLi (i is an integer of 0 to 7) are first sequentially selected for all fingers FNG0 to FNG3, and a subsequent word line WL(i+1) is selected. Further, data is written in the word line WL closer to the selection gate line SGS.

In an example in FIG. 4, the word line WL0 of the finger FNG0 is first selected, the word line WL0 of the finger FNG1 is next selected, the word line WL0 of the finger FNG2 is then selected, and the word line WL0 of the finger FNG3 is further selected. Thus, after writing data in the word lines WL0 is finished, the word lines WL1 are selected.

That is, the word line WL1 of the finger FNG0 is first selected, the word line WL1 of the finger FNG1 is next selected, the word line WL1 of the finger FNG2 is then selected, and the word line WL1 of the finger FNG3 is further selected. The same applies for remaining word lines WL. In addition, an address for designating each finger FNG will be referred to as a finger address FNG_ADD.

1.2.2 Flow of Writing Operation

Next, the writing operation according to the present embodiment will be described with reference to FIGS. 5A and 5B. FIGS. 5A and 5B are flowcharts of the writing operation according to the present embodiment.

First, the controller 200 receives a write access request from the host apparatus 300. The controller 200 starts writing preparation in response to this write access request. When the writing preparation is completed, the controller 200 requests the NAND flash memory 100 to program the data (step S10). The completion of the writing preparation corresponds to, for example, the completion of ECC encoding (generation of a parity) in the processor 230 of the controller 200 is finished, and triggers the processor 230 to execute processing in step S10. That is, the processor 230 issues a write command to the NAND flash memory 100, and this command is held in the command register 160 of the NAND flash memory 100.

Subsequently, the processor 230 transfers an address of a write target region and write data in, for example, the buffer memory 240 to the NAND flash memory 100 (step S11). The address received by the NAND flash memory 100 is held in the address register 150, and the write data is held in a page buffer of the sense amplifier 140.

The sequencer 170 of the NAND flash memory 100 starts the writing operation in response to the fact that the write command has been held in the command register 160. That is, the sequencer 170 commands the voltage generator circuit 180 to generate a voltage required for writing. Further, the sequencer 170 refers to the address register 150 to check whether or not the programming target finger address FNG_ADD corresponds to the finger FNG (the finger FNG0 in this example) which is programmed first for the given word line WL (step S12). When the finger address FNG_ADD does not correspond to the finger FNG0 (step S13, NO), i.e., when the finger address FNG_ADD corresponds to one of the fingers FNG1 to FNG3, data is written in page units according to the address held in the address register 150 (step S14).

On the other hand, when the programming target finger address FNG_ADD corresponds to the finger FNG0 (step S13, YES), the sequencer 170 causes the voltage generator circuit 180 to generate a voltage V0 higher than an initial value of a program voltage VPGM for programming the data by way of FN tunneling. Further, the sequencer 170 causes the driver circuit 130 to apply a word line leakage inducing pulse VLAP to the selected word line WLi in a state where all bit lines BL are placed in a non-selected state (step S15). A potential of this inducing pulse VLAP is the voltage V0 generated by the above-described voltage generator circuit. However, applying the inducing pulse VLAP is not a data programming operation but an operation of inducing current leakage, i.e., short-circuiting between the selected word line WLi and one of the non-selected word lines WL (e.g., non-selected word lines WL(i+1) and/or WL(i−1) adjacent to the word line WLi). Subsequently, the data is programmed in step S14.

After step S14, the controller 200 requests the NAND flash memory 100 to read a status (step S16). That is, the processor 230 issues a status read command, and this command is held in the command register 160. In addition, when the NAND flash memory 100 is in the busy state (step S17, YES), the NAND flash memory 100 cannot accept the command, and therefore step S16 is performed again. When the NAND flash memory 100 is in the ready state (step S17, NO), the NAND flash memory 100 accepts the status read command and outputs status information to the controller 200.

When the received status information indicates that the programming has passed (step S18, YES), the processor 230 performs processing of completing the writing operation (step S19). Further, the processor 230 informs the host apparatus of completing the writing.

When the received status information indicates that the programming has failed (step S18, NO), the processor 230 checks the address of the finger FNG which has been programmed (step S20). Further, when the finger address FNG_ADD does not correspond to the finger FNG0 (step S21, NO), the processor 230 executes write error processing (step S22). Further, the processor 230 informs the host apparatus 300 of failing the writing.

On the other hand, when the finger address FNG_ADD corresponds to the finger FNG0 (step S21, YES), the processor 230 selects another word line WL (e.g., word line WL(i+1)), and returns to step S10 to execute the programming again.

1.2.3 Command Sequence

Next, a command sequence in the writing operation will be described. FIG. 6 is a timing chart of various signals on the NAND bus in steps S10 and S11 in FIG. 5A.

As illustrated in FIG. 6, the controller 200 first issues a normal write command "80h" defined by a NAND interface (corresponding to step S10 in FIG. 5A), and asserts the signal CLE. Subsequently, the controller 200 issues addresses (A1 to A5: including a column address, a block address and a page address) for five cycles, asserts the signal ALE, then outputs write data D1 to Dn (n is a natural number equal to or more than 2) for a plurality of cycles and negates the signals ALE and CLE (corresponding to step S11 in FIG. 5A).

Next, the controller 200 issues a write command "10H", and asserts the signal CLE. The sequencer 170 starts the writing operation in response to the fact that the command "10H" has been stored in the command register 160, and the NAND flash memory 100 enters the busy state (RBn="L"). In addition, the controller 200 asserts the signal WEn every time the controller 200 issues a signal such as a command, an address or data. Hence, every time WEn is toggled, a signal is taken in by the NAND flash memory 100.

1.2.4 Word Line Voltage

Next, a voltage to be applied to the word line WL of the NAND flash memory 100 in the writing operation will be described. FIG. 7 is a timing chart illustrating a voltage to be applied to the selected word line WLi in steps S15 and S14 in FIG. 5A, and illustrates that the finger address FNG_ADD corresponds to the finger FNG0.

As illustrated in FIG. 7, the driver circuit 130 applies the inducing pulse VLAP to the selected word line WLi through the row decoders 120. In this case, the sense amplifier 140 places all bit lines BL in a non-selected state according to the command of the sequencer 170. More specifically, potentials of all bit lines BL are set to a certain potential (e.g., a positive voltage VDD). Further, for example, a voltage VPASS is applied to the non-selected word lines WL. The voltage VPASS is a voltage which turns on the memory cell transistor MT regardless of held data, and can sufficiently boost a potential of a channel in the NAND string 10 corresponding to writing of "0" data (which is a writing operation of preventing injection of charges to the charge storage layer, and preventing a transition of a threshold level) by way of capacitive coupling. Further, a voltage (e.g., 0 V) which places the selection transistor ST1 in an off-state is applied to the selection gate line SGD.

FIG. 8 illustrates this state. FIG. 8 is a schematic view illustrating a potential of each line in the block BLK when the inducing pulse VLAP is applied to the selected word line WLi. As illustrated in FIG. 8, the inducing pulse VLAP is applied to the selected word line WLi, the voltage VPASS is applied to the non-selected word lines WL, and a voltage Voff is applied to all of the four selection gate lines SGD0 to SGD3 and the selection gate lines SGS0 to SGS3 corresponding to the selected block BLK. The voltage Voff is a voltage which turns off the selection transistors ST1 and ST2, and may be 0 V as described above or a negative voltage.

As described above, applying the inducing pulse VLAP is not a data programming operation, and therefore a verifying operation is not performed after the inducing pulse VLAP is applied. Subsequently, write data is set to a latch circuit in the sense amplifier 140 (which is referred to as pre-lockout). Since an operation of applying the inducing pulse VLAP is not a programming operation, and therefore this operation (pre-lockout) is also not executed before the inducing pulse VLAP is applied.

When the write data (page data) is set to the latch circuit in the sense amplifier 140, a normal programming sequence starts at a time t1. That is, first, at the time t1, writing of page data corresponding to the word line WLi of the finger FNG0 is started. The writing operation includes a programming operation of injecting charges in the charge storage layer by applying the voltage VPGM to the selected word line WLi, and a verifying operation of checking whether or not a threshold voltage reaches a desired level by applying a verify voltage Vvfy to the selected word lines WLi. Further, writing data includes a repetition of a combination of the programming operation and the verifying operation (which is referred to as a program loop) as illustrated in FIG. 7, and is finished at a point of time at which the verifying operation passes or the number of times of loops reaches a predetermined number of times (m times in an example in FIG. 7 where m is a natural number equal to or more than two). In this regard, the voltage VPGM is stepped up every program loop. When the voltage VPGM used in the first loop is VPGM1, VPGM1<VLAP holds. Further, in the example in FIG. 7, VPGMm<VLAP holds. However, for example, VPGMm>VLAP may hold.

When writing of the page data corresponding to the word line WLi of the finger FNG0 is completed, writing of page data corresponding to the next finger FNG1 is started at a time t2.

1.2.5 Status Read Command

Figures 9, 10:
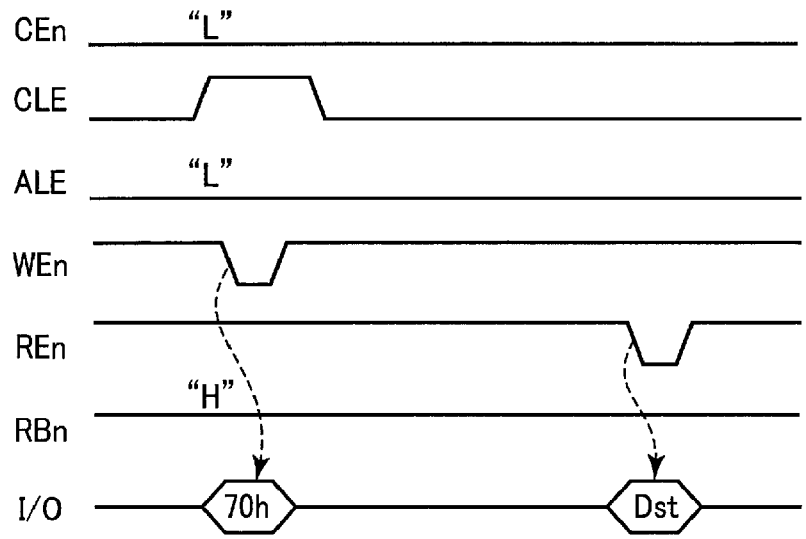
FIG. 9 illustrates a command sequence in status reading according to the first embodiment.
FIG. 10 is a diagram illustrating status information according to the first embodiment.

Next, the status read command in the writing operation will be described. FIG. 9 is a timing chart of various signals on the NAND bus in step S16 in FIG. 5B.

As illustrated in FIG. 9, the controller 200 first issues a status read command "70h", and asserts the signals CLE and WEn. Thus, the status read command is held in the command register 160 in the NAND flash memory 100. Then, the sequencer 170 stores various pieces of status information in a status register.

Subsequently, when the controller 200 asserts the signal REn, the NAND flash memory 100 outputs the status information to the controller 200 in response to the assertion.

FIG. 10 illustrates information read according to the status read command "70h" which complies with the NAND interface. As illustrated in FIG. 10, each bit of an 8-bit signal I/O indicates each status, and, in the case of FIG. 10, it is possible to check whether the programming has passed or failed by checking whether the bit of I/O [0] is "0" or "1".

1.3 Effect of Present Embodiment

According to the present embodiment, it is possible to detect current leakage between word lines early, and prevent loss of data. The effect of the present embodiment will be described below.

As described with reference to FIGS. 2 and 3, a plurality of the fingers FNG shares the word lines WL in the three-dimensional stack-type NAND flash memory. Hence, when short-circuiting occurs between the word lines WL and a leakage current flows (which is referred to simply as "WL leakage"), there is a concern that items of data of all fingers FNG which share these word lines WL will be destroyed.

FIG. 11 schematically illustrates this state. As illustrated in FIG. 11, it is assumed that when data is sequentially written in the word line WL0 of the finger FNG0 to the word line WL1 of the finger FNG3, the WL leakage occurs between the word lines WL0 and WL1. Then, all items of data of eight pages which have been written in the word lines WL0 and WL1 so far are lost. This is a case where each memory cell transistor MT holds 1-bit data, and, in a case where each memory cell transistor MT holds 2-bit data, data of 16 pages, which is double the data of 8 pages, is lost.

Hence, the controller 200 needs to hold write data of the 8 pages for the word lines WL0 and WL1 as backup data in preparation for occurrence of WL leakage.

In this regard, according to the configuration of the present embodiment, when data is first written in one of the word lines WL, the leakage inducing pulse VLAP is applied to this word line WL. This inducing pulse VLAP is a high voltage equal to the voltage VPGM, and is likely to trigger short-circuiting between a selected word line and one of the non-selected word lines. Further, when a leakage current flows, programming to the finger FNG0 for the word line WL in which data is first written fails and is finished. When the programming fails and is finished, the controller 200 can decide that the word line WL is a bad word line.

That is, the memory cell array 110 is likely to include the word line WL which causes WL leakage when a little stress is applied even though the WL leakage does not currently occur. Hence, in the present embodiment, the inducing pulse VLAP is applied before data is actually written to cause WL leakage in this word line WL. In other words, the word line WL which is not yet a bad word line yet but is likely to be a bad word line is proactively made a bad word line by applying the inducing pulse VLAP.

Thus, in an example in FIG. 11, when, for example, the word line WL1 is selected, WL leakage may be detected in writing of data in the first finger FNG0. Further, the controller 200 can stop use of this word line WL1 at the point in time of detection. Consequently, data of the 8 pages is not lost as described in the example in FIG. 11, and data of one page only needs to be backed up.

Consequently, it is possible to reduce a back-up region required in the controller 200, and reduce manufacturing cost of the memory system 1. Further, it is also possible to reduce a time required to write backed-up data again.

2. Second Embodiment

A semiconductor memory device and a memory system according to the second embodiment will be described. The present embodiment differs from the first embodiment in that, instead of a controller 200, a NAND flash memory 100 decides whether or not WL leakage occurs. Only portions which are not described in the first embodiment and differences from the first embodiment will be described below.

2.1 Configuration of Row Decoder 120

The row decoder 120 described in FIG. 1 will be described in detail with reference to FIG. 12. FIG. 12 is a circuit diagram of the row decoder 120 and a driver circuit 130.

As illustrated in FIG. 12, the row decoder 120 functions as a switch which transfers the voltage output from the corresponding driver circuit 130, to corresponding lines WL, SGD and SGS. In addition, FIG. 12 illustrates an example where selection gate lines SGS0 to SGS3 are prepared per finger FNG.

As illustrated in FIG. 12, the row decoder 120 includes a block decoder 50, and high withstand-voltage n-channel MOS transistors 51 to 55 (51-0 to 51-7, 52-0 to 52-3, 53-0 to 53-3, 54-0 to 54-3 and 55-0 to 55-3).

The transistor 51 transfers the voltage to the word line WL of a corresponding block BLK. That is, the transistors 51-0 to 51-7 include sources and drains ones of which are connected to word lines WL0 to WL7 of the corresponding block BLK, respectively, and the other ones of which are connected to signal lines CG0 to CG7, respectively, and gates which are commonly connected to a signal line TG.

The transistors 52 and 53 transfer voltages to the selection gate lines SGD. That is, the transistors 52-0 to 52-3 include the sources and the drains ones of which are connected to selection gate lines SGD0 to SGD3 of the corresponding block BLK, and the other ones of which are connected to signal lines SGDD0 to SGDD3, and gates which are commonly connected to the signal line TG. Further, the transistors 53-0 to 53-3 include the sources and the drains ones of which are connected to the selection gate lines SGD0 to SGD3 of the corresponding block BLK, and the other ones of which are connected to nodes SGD_COM, respectively, and gates which are commonly connected to a signal line RDECADn. An inverse signal of a signal applied to the signal line TG is given to the signal line RDECADn. A voltage such as 0 V which turns off a selection transistor ST1 is applied to the node SGD_COM.

The transistors 54 and 55 transfer voltages to the selection gate lines SGS. Further, connections in the transistors 54 and 55 are equivalent to connections formed by replacing the selection gate lines SGD with the selection gate lines SGS, replacing the signal lines SGDD with signal lines SGSD and replacing nodes SGD_COM with nodes SGS_COM in the transistors 52 and 53.

The block decoder 50 decodes a block address BA given from an address register 150. Further, when the block address BA is an address for designating the corresponding block BLK, the block decoder 50 applies an "H" level to the signal line TG to turn on the transistors 51, 52 and 54. On the other hand, when the block address BA is an address which does not designate the corresponding block BLK, the block decoder 50 applies an "L" level to the signal line TG to turn off the transistors 51, 52 and 54.

2.2 Configuration of Driver Circuit 130

Next, the configuration of the driver circuit 130 will be described in detail with reference to FIG. 12. The driver circuit 130 decodes a page address PA given from the address register 150. Further, driver circuit 130 applies voltages required to write, read and erase to the signal lines CG0 to CG7, SGDD0 to SGDD3 and SGSD0 to SGSD3 according to a decoding result of the page address PA.

As illustrated in FIG. 12, the driver circuit 130 includes WL drivers 60 (60-0 to 60-7), SGD drivers 61 (61-0 to 61-3) and SGS drivers 62 (62-0 to 62-3).

The WL drivers 60-0 to 60-7 transfer necessary voltages to the signal lines CG0 to CG7. Further, one of the signal line CG is selected based on the decoding result of the page address PA, and a predetermined voltage is applied to a selected signal line CG and non-selected lines CG by the WL drivers 60-0 to 60-7.

The SGD drivers 61-0 to 61-3 transfer necessary voltages to the signal lines SGDD0 to SGDD3 according to the decoding result of the page address PA. The SGS drivers 62-0 to 62-3 transfer necessary voltages to the signal lines SGSD0 to SGSD3 according to the decoding result of the page address PA. That is, SGD drivers 61-0 to 61-3 and SGS drivers 62-0 to 62-3 select one of fingers FNG0 to FNG3.

FIG. 13 is a circuit diagram illustrating an example of the WL driver 60. As illustrated in FIG. 13, the WL driver 60 includes three high withstand-voltage n-channel MOS transistors 70 to 72.

The transistor 70 includes a gate to which a signal G_PGM is applied, and a source and a drain one of which is applied a voltage VPGM or VLAP and the other one of which is coupled to the corresponding signal line CG. Further, the transistor 70 applies the voltages VPGM and VLAP to a selected signal line CGi in steps S14 and S15 described with reference to FIG. 5A.

The transistor 71 includes a gate to which a signal G_CGRV is applied and a source and a drain one of which is applied a voltage VCGRV and the other one of which is coupled to the signal line CG. Further, in reading of data, the transistor 72 applies the voltage VCGRV corresponding to a read level, to the selected signal line CGi.

The transistor 72 includes a gate to which a signal G_USEL is applied, and a source and a drain one of which is applied a voltage VPASS in writing and is applied a voltage VREAD in reading and the other one of which is coupled to the corresponding signal line CG. Further, the transistor 72 applies the voltage VPASS to the non-selected signal lines CG in data writing, and applies the voltage VREAD to the non-selected signal lines CG in data reading. The voltage VREAD is a voltage which turns on a memory cell transistor MT irrespective of held data.

The SGD and SGS drivers 61 and 62 also employ the same configuration.

The voltages which the SGD and SGS drivers 61 and 62 apply to the signal lines CG, SGDD and SGSD are given from a voltage generator circuit 180. The voltage generator circuit 180 generates voltages VLAP, VPGM, VPASS and VREAD and the like required for each operation according to a command of a sequencer 170. A configuration disclosed in, for example, U.S. patent application Ser. No. 13/603,800 filed on Sep. 5, 2012 entitled "VOLTAGE GENERATOR" can be used for the configuration of the voltage generator circuit 180. The entire contents of this patent application are incorporated herein by reference. Further, the voltage generator circuit 180 monitors the voltage generated by the voltage generator circuit 180, and compares the monitored voltage and a reference voltage. Thus, the voltage generator circuit 180 can decide whether or not the generated voltage reaches a desired value. Further, the voltage generator circuit 180 which generates the voltage VPGM outputs a monitoring result as a flag to the sequencer 170.

2.2 Writing Operation

Figure 14A:
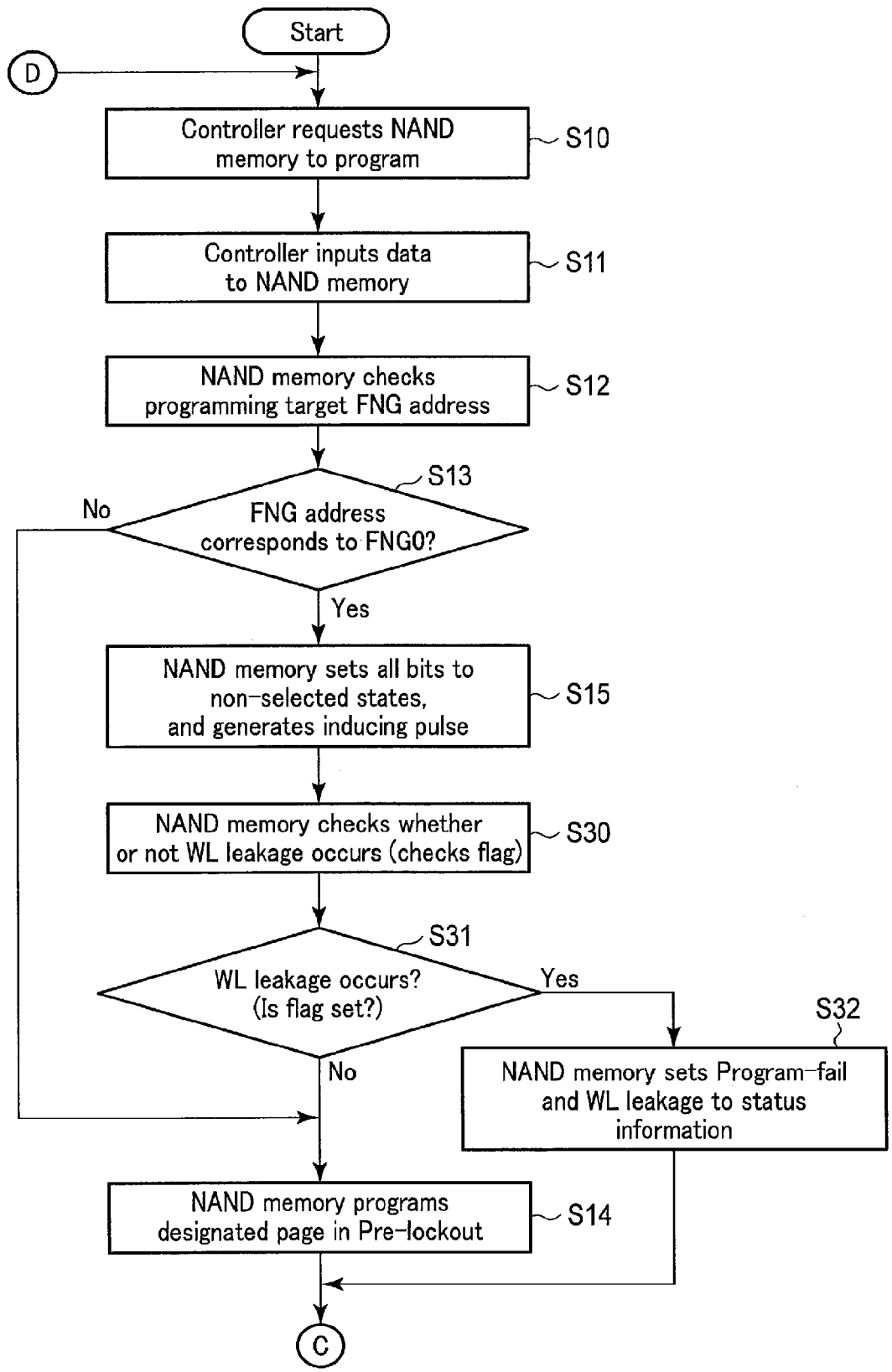
FIGS. 14A and 14B are flowcharts of a data writing method according to the second embodiment.
Figure 14B:
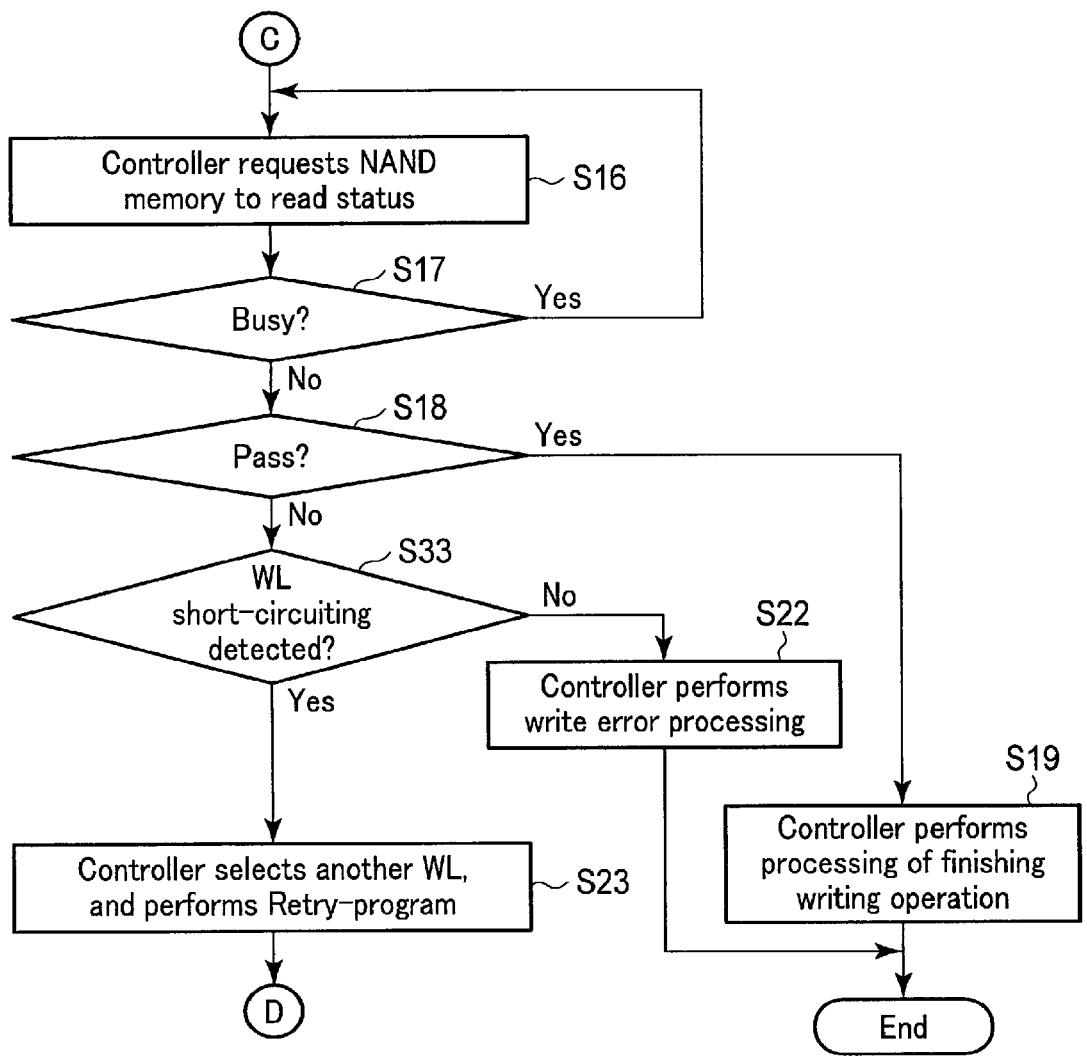

Next, a data writing method in the memory system according to the present embodiment will be described. FIGS. 14A and 14B are flowcharts of the writing operation according to the present embodiment. As illustrated in FIGS. 14A and 14B, there are the following two differences from FIGS. 5A and 5B described in the first embodiment.

(1) After applying the inducing pulse VLAP in step S15, the sequencer 170 instructs the voltage generator circuit 180 to generate the voltage VPGM, and checks a flag given from the voltage generator circuit 180 (step S30). Further, when the flag is not set (step S31, NO), the sequencer 170 decides that WL leakage does not occur, and the operation moves to step S14. On the other hand, when the flag is set (step S31, YES), the sequencer 170 decides that the WL leakage occurs, and sets information indicating that programming has failed and information indicating that the WL leakage has occurred as status information to a status register 190 (step S32), and the operation of a memory system 1 moves to processing in S16 without performing a programming operation.

(2) In a case where the information indicating that the programming has failed has been set to the status information in step S18 (step S18, NO), the processor 230 further checks whether or not WL short-circuiting has been detected, based on the status information (step S33). When the WL short-circuiting is not detected, the operation moves to processing in step S22 and, when the WL short-circuiting is detected, the operation moves to processing in step S23.

2.3 Leakage Detecting Method

The WL leakage detecting method according to the present embodiment will be described with reference to FIG. 15. FIG. 15 is a timing chart of a voltage to be applied to each line in data programming, and corresponds to a view illustrating one program loop in FIG. 7 in detail.

As illustrated in FIG. 15, at a time t0, the SGD driver 61 applies a voltage VSGD_prog to the selection gate line SGD of the selected finger FNG. The voltage VSGD_prog is a voltage which turns on the selection transistor ST1. Further, the SGD driver 61 and the SGS driver 62 apply 0 V to the selection gate lines SGD and all selection gate lines SGS of the non-selected fingers FNG.

Further, at a time t1, a sense amplifier 140 applies 0 V to bit lines BL in which "0" data is to be written, and applies a positive voltage Vbl to the bit lines BL in which "1" data is to be written. Writing the "0" data is a writing operation of boosting a threshold voltage of the memory cell transistor MT by injecting electrons to a charge storage layer of the memory cell transistor MT, and causing a transition of a threshold level to a higher level as a result. On the other hand, writing the "1" data is a writing operation of maintaining the threshold level by preventing injection of electrons in the charge storage layer of the memory cell transistor MT (i.e., the threshold voltage substantially does not change).

Subsequently, at a time t2, the SGD driver 61 applies a voltage VSGD (e.g., VSGD_prog>VSGD) to the selection gate line SGD of the selected finger FNG. The voltage VSGD_prog is a voltage which enables the selection transistor ST1 to transfer the voltage Vbl. On the other hand, the voltage VSGD is a voltage which enables the selection transistor ST1 to transfer 0 V, and yet does not enable the selection transistor ST1 to transfer the voltage Vbl. Hence, the selection transistor ST1 corresponding to the bit lines BL in which the "1" is to be written becomes a cut-off state.

Next, at a time t3, the signal G_USEL is set at an "H" level, and the transistor 72 enters the on-state in the WL driver 60. As a result, the voltage VPASS is applied to the word lines WL0 to WL7.

Subsequently, at a time t4, the signal G_PGM is set at the "H" level, and the transistor 70 enters the on state in the WL driver 60 corresponding to the selected word line WL. As a result, the voltage VPGM is applied to the selected word line WL. After data is programmed in the time t4 to a time t5, the WL driver 60 lowers the voltage of the selected word line WL to VPASS.

Next, a verifying operation is performed. That is, a voltage VSG is applied to the selection gate lines SGD and SGS, and the voltage VREAD is applied to the non-selected word lines WL and the verify voltage Vvfy is applied to the selected word line WL.

In the above writing operation, the voltage generator circuit 180 which generates the voltage VPGM sets a flag to an "L" level when the voltage VPGM reaches a desired value, and sets the flag to an "H" level when the voltage VPGM does not reach a desired value. Hence, in an "H" level period of the flag, a charge pump circuit performs a boosting operation in the voltage generator circuit 180 to boost the generated voltage. That is, when data is programmed, a flag is set to the "L" level (the flag is set) at least once in the period of the time t4 to the time t5.

In this regard, when short-circuiting failure occurs between the selected word line WL and one of the non-selected word lines WL, a leakage current flows from the selected word line WL to the non-selected word line WL. As a result, the voltage of the selected word line WL does not reach a desired value no matter how much time passes, and is boosted up to the same value as the voltage VPASS at maximum. Hence, the flag is not set to the "L" level in the period of the time t4 to the time t5. That is, the flag is not set.

By taking an advantage of the above characteristics, the sequencer 170 uses, as a WL leakage detection circuit, a circuit which compares a monitor voltage and the reference voltage and generates a flag in the voltage generator circuit 180, and monitors this flag to decide whether or not WL leakage occurs.

2.4 Status Read Command

Figures 16, 17, 18:
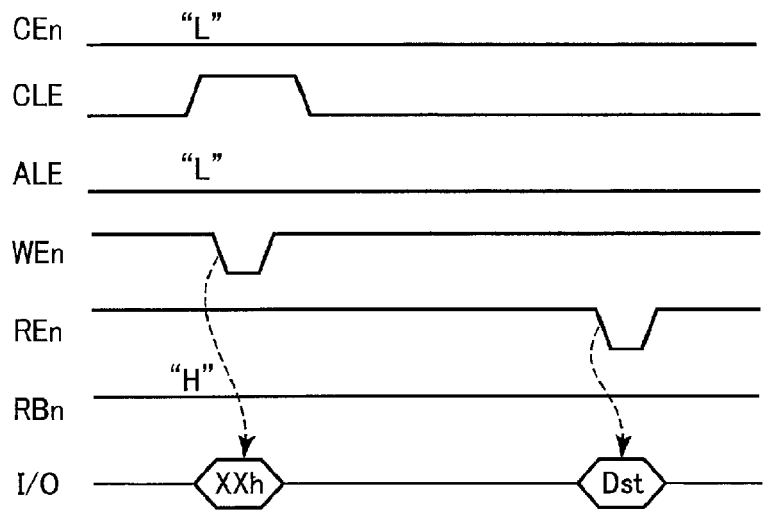
FIG. 16 illustrates a command sequence in status reading according to the second embodiment.
FIG. 17 is a diagram illustrating status information according to the second embodiment.
FIG. 18 is a conceptual diagram of a history table according to a third embodiment.

Next, a status read command according to the present embodiment will be described. FIG. 16 is a timing chart of various signals on a NAND bus in step S16 in FIG. 14B. A difference from FIG. 9 described in the first embodiment is that a command "XXh" is used as a status read command instead of "70h".

FIG. 17 illustrates information read by the status read command "XXh". A difference from FIG. 10 described in the first embodiment is that a bit of I/O[2] indicates whether or not WL short-circuiting occurs. This bit is set by the sequencer 170 checking the flag. That is, when a flag is set even once in the period of the time t4 to the time t5, it is decided that WL short-circuiting does not occur and "0" is set to I/O[2]. On the other hand, when the flag is not set even once, it is decided that WL short-circuiting occurs and "1" is set to I/O[2].

2.5 Effect of Present Embodiment

According to the present embodiment, it is possible to more accurately decide whether or not WL leakage occurs. That is, according to the present embodiment, the voltage generator circuit 180 has a WL leakage detecting function, and the sequencer 170 transmits information indicating whether or not WL leakage occurs as status information to the controller 200 based on a detection result of this function. That is, the controller 200 can obtain not only information indicating whether programming has failed or passed but also information related to whether or not WL leakage occurs, by using a status read command.

Further, according to the present embodiment, a programming operation is stopped at a point in time at which WL leakage is detected. Consequently, it is possible to prevent a high voltage from being unnecessarily applied to the memory cell transistor MT. More specifically, it is possible to prevent the voltage VPASS from being unnecessarily applied to the non-selected memory cell transistors MT which has no short-circuit failure. As a result, it is possible to improve a reliability of the memory cell transistors MT.

In addition, using a new command as a status read command instead of "70h" has been described in the above example.

However, "70h" may be used for the command, and any configuration may be employed as far as it transmits WL leakage information in response to the status read command.

3. Third Embodiment

Next, a semiconductor memory device and a memory system according to the third embodiment will be described. The present embodiment differs from the first and second embodiments in generating an inducing pulse VLAP based on a command of a controller 200. Only differences from the first and second embodiments will be described below.

3.1 History Table

An embedded memory 220 of the controller 200 according to the present embodiment stores a history table. FIG. 18 is a conceptual diagram of the history table.

As illustrated in FIG. 18, the history table holds information indicating whether or not each word line WL has been previously applied the inducing pulse VLAP, and whether or not programming has then succeeded (i.e., whether or not WL leakage has been detected).

A method of determining whether or not the WL leakage has been detected may be any method described with reference to the first and second embodiments.

3.2 Writing Operation

Figure 19B:
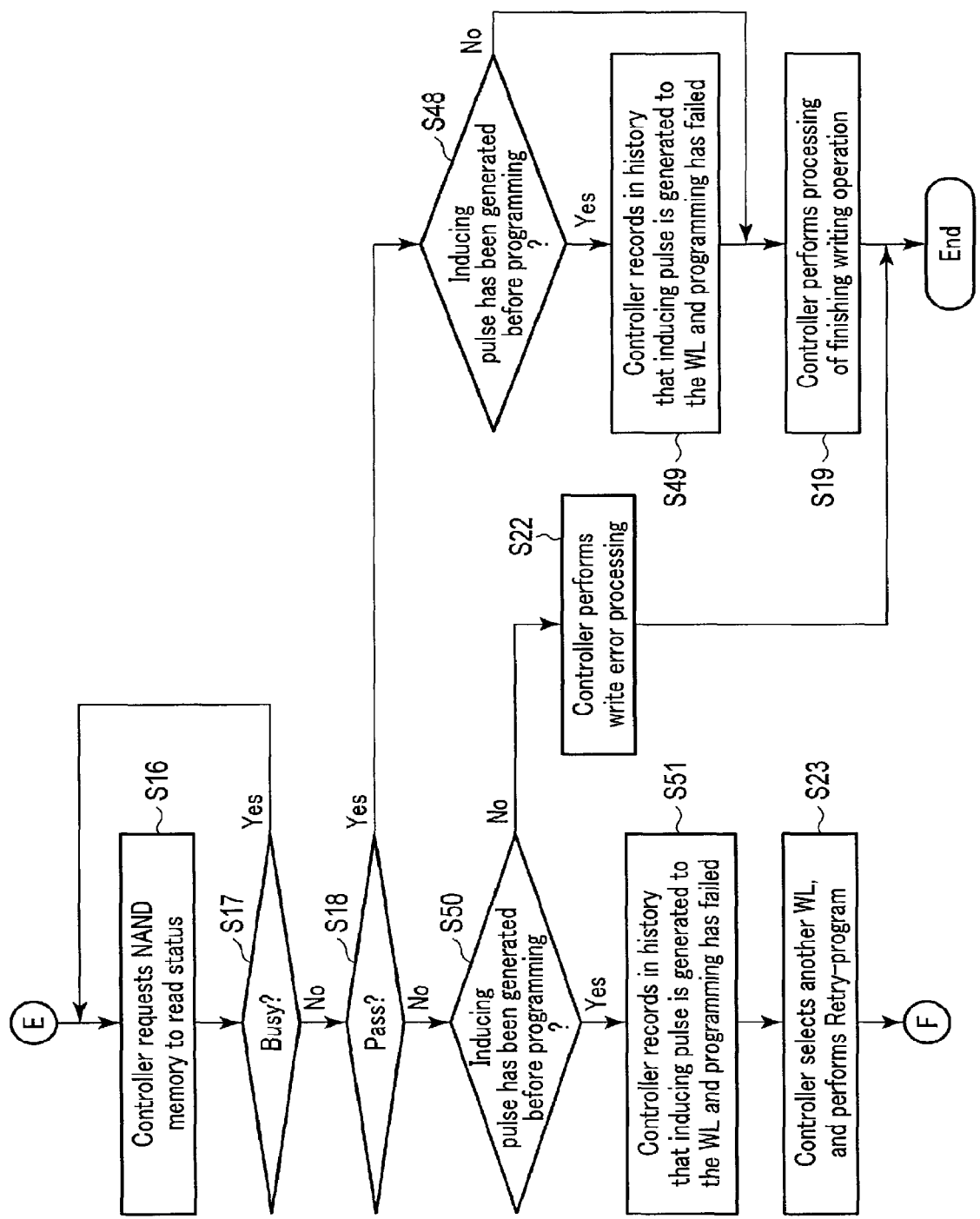

Next, a data writing method in the memory system according to the present embodiment will be described with reference to FIGS. 19A and 19B. Differences from those in FIGS. 5A and 5B described in the first embodiment will be focused on and described below.

First, a processor 230 of the controller 200 refers to the history table using an access target address as an index when writing preparation is completed. Further, the processor 230 checks whether or not the inducing pulse VLAP has been previously applied to a corresponding word line WL (step S40).

If inducing pulse VLAP has not been applied as a result of step S40 (step S41, NO), the processor 230 outputs an inducing pulse issuance command to a NAND flash memory 100 (step S42). This command is held in an address register 150. Further, processing in steps S10 and S11 is performed. Furthermore, issuance of an inducing pulse command to the NAND flash memory 100 is recorded as a log of processing performed on the NAND flash memory 100 in, for example, the embedded memory 220.

On the other hand, if the inducing pulse VLAP has not already been applied as a result of step S40 (step S41, YES), the processor 230 subsequently refers to the history table, and checks whether or not programming the word line WL has failed (step S43). If the programming has not failed (step S43, NO), processing in steps S10 and S11 is performed.

If the programming has failed in step S43 (step S43, YES), the processor 230 changes the programming target word line WL to another word line WL (step S44). Further, processing in steps S10 and S11 is performed.

After step S11, a sequencer 170 of the NAND flash memory 100 refers to the address register 150, and decides whether or not a command to issue the inducing pulse VLAP has been given (step S45). If the command to issue the inducing pulse VLAP has not been given (step S45, NO), the sequencer 170 executes a writing operation without applying the inducing pulse VLAP (step S46).

On the other hand, if the command to issue the inducing pulse VLAP has been given (step S45, YES), the sequencer 170 sets all bits in a non-selected state and generates the inducing pulse VLAP (step S47). This processing is the same as step S15 described in the first embodiment. Subsequently, the sequencer 170 executes the writing operation (step S46).

Subsequently, the processor 230 of the controller 200 performs processing in steps S16 to S18, and, when a read status indicates that programming has passed (step S18, YES), the processor 230 checks whether or not the inducing pulse VLAP has been generated before the programming (step S48). The processor 230 can check whether or not the inducing pulse VLAP has been generated by referring to a log held in the embedded memory 220 (the same also applies to step S50 described later). If the inducing pulse VLAP has not been generated (step S48, NO), the processor 230 performs processing in step S19. If the inducing pulse VLAP has been generated (step S48, YES), the processor 230 updates the history table. That is, the processor 230 records "pass" as a result of a status corresponding to the word line WL (step S49), and performs processing in step S19.

If the read status indicates that the programming has failed in step S18 (step S18, NO), the processor 230 checks whether or not the inducing pulse VLAP has been generated before the programming (step S50). If the inducing pulse VLAP has not been generated (step S50, NO), the processor 230 performs processing in step S22. If the inducing pulse VLAP has been generated (step S50, YES), the processor 230 updates the history table. That is, the processor 230 records "fail" as a result of a status corresponding to the word line WL (step S51), and performs processing in step S23.

FIG. 20 is a timing chart of various signals on a NAND bus in steps S42, S10 and S11 in FIG. 19. As illustrated in FIG. 20, a difference from FIG. 6 described in the first embodiment is that a prefix command "YYh" is issued before a write command "80h". This command "YYh" is a command to issue the inducing pulse VLAP.

A voltage to be applied to the word line WL in writing of data is as described in the first embodiment with reference to FIG. 7. Meanwhile, when a pulse issuance command in step S42 is not given, naturally, the inducing pulse VLAP is not given at a time t0 to a time t1.

3.3 Effect of Present Embodiment

According to the present embodiment, the controller 200 can arbitrarily decide a timing to apply the inducing pulse VLAP. Further, in this case, by using the history table, it is not necessary to apply the inducing pulse VLAP again to the word line WL for which whether or not WL leakage has occurred has already been determined. Consequently, it is possible to apply the minimum required inducing pulse VLAP.

In addition, a case where a status read command described in the first embodiment with reference to FIGS. 9 and 10 has been described in the present embodiment. However, the status read command described in the second embodiment with reference to FIGS. 16 and 17 may be used. Further, in this case, it is possible to determine whether or not WL leakage occurs, based on a flag output from, for example, a voltage generator circuit 180 of the NAND flash memory 100 as described in the second embodiment. Hence, when WL leakage is detected based on this flag, step S32 described with reference to FIG. 14 may be executed, and processing in step S46 may be skipped.

Further, the history table is held in the controller 200, and therefore is initialized rebooting of a memory system 1. However, depending on the case, the history table may be stored in one of blocks BLK (e.g., a ROM fuse) of the NAND flash memory 100, and may be read from the NAND flash memory 100 by the controller 200 at rebooting.

4. Fourth Embodiment

Next, a semiconductor memory device and a memory system according to the fourth embodiment will be described. In the present embodiment, an inducing pulse VLAP is generated based on a command of a controller 200 similarly to the third embodiment. A difference from the third embodiment is that the controller 200 holds information (risk table) related to a word line WL which is likely to cause WL leakage, and outputs a command to issue an inducing pulse VLAP based on the information. Only differences from the third embodiment will be described below.

4.1 Risk Table

First, the risk table will be described. The risk table holds, for example, the following information.

Word lines WL which are likely to cause WL leakage

Information related to care contents which need to be provided to the word lines WL This information is, for example, a frequency to apply an inducing pulse, and is information indicating that an inducing pulse is applied once every ten writing operations.

Information related to care contents which have been previously executed

This is information indicating how many times the writing operations are performed on the word line WL after the last time the inducing pulse VLAP is applied.

Leakage generation information of word line WL

This is information indicating whether or not WL leakage has occurred since the inducing pulse VLAP has been previously applied.

The risk table is held in one of blocks BLK (e.g., a ROM fuse) of a NAND flash memory 100, and is read to an embedded memory of the controller 200 when the NAND flash memory 100 is powered on. Further, the risk table is updated by the controller 200, and may be stored in the NAND flash memory 100 at an arbitrary timing such as a timing at which a power supply to the NAND flash memory 100 is turned off.

Further, the risk table may not be held in the NAND flash memory 100. In this case, for example, a processor 230 of the controller 200 executes firmware to generate a risk table and cause an embedded memory 220 to hold the risk table.

4.2 Writing Operation

Figure 21A:
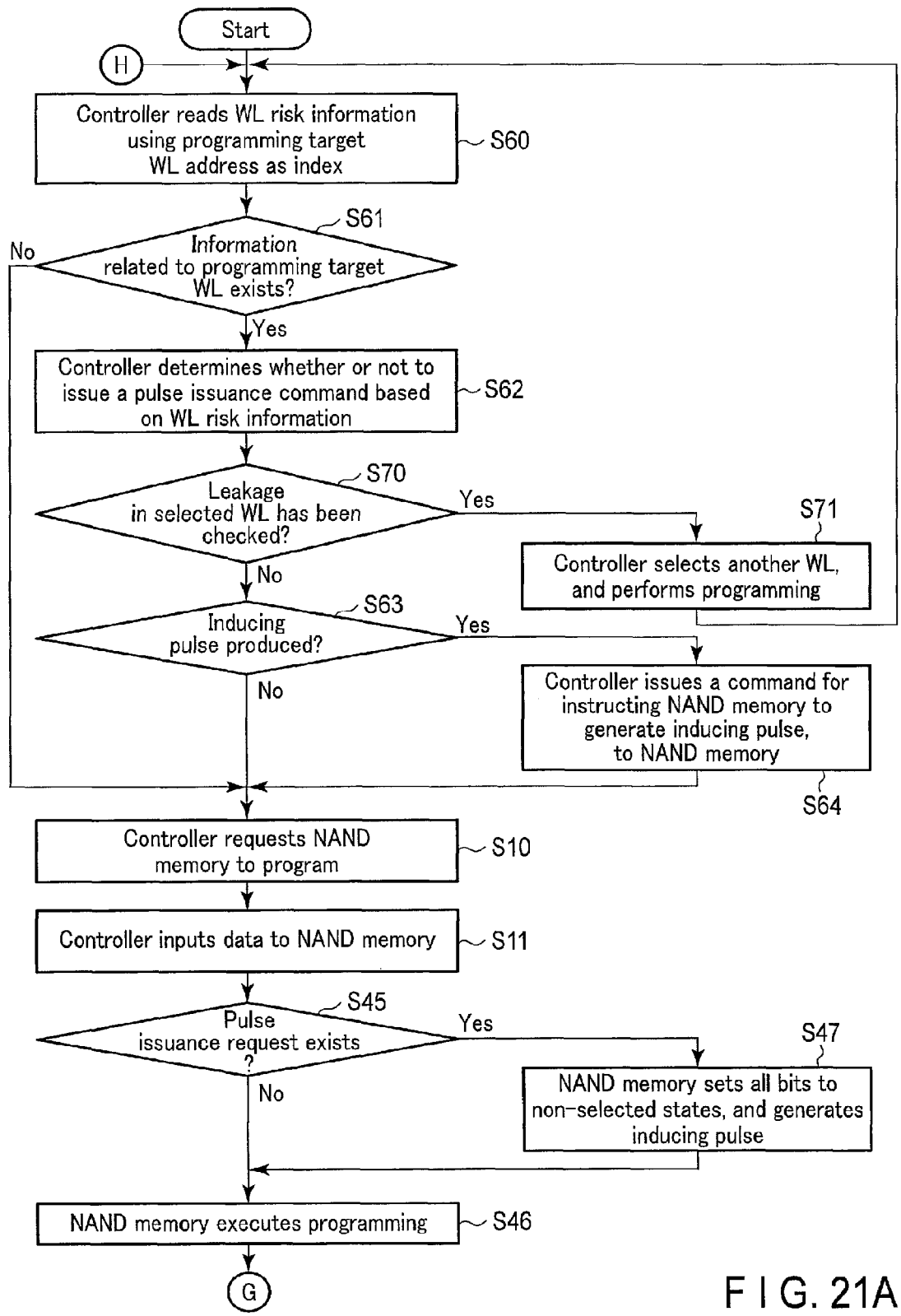
FIGS. 21A and 21B are flowcharts of a data writing method according to the third embodiment.
Figure 21B:
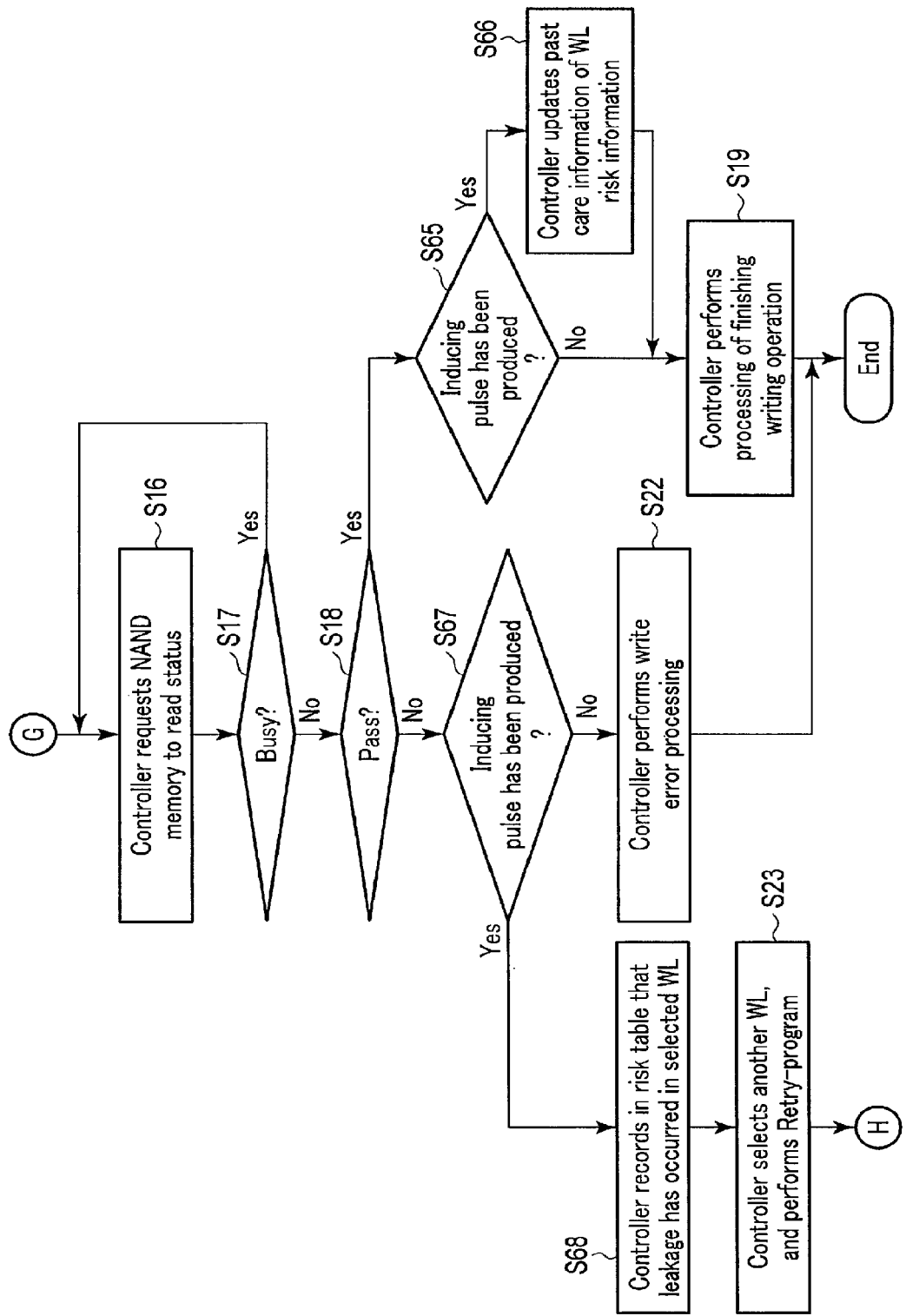

Next, a data writing method in the memory system according to the present embodiment will be described with reference to FIGS. 21A and 21B. Differences from those in FIGS. 19A and 19B described in the third embodiment will be focused on and described below.

First, when completing writing preparation, the processor 230 of the controller 200 refers to the risk table using an access target word line address as an index (step S60). When there is no information related to the word line WL in the risk table (step S61, NO), the processor 230 decides that this word line WL is a word line which is not particularly likely to cause WL leakage and it is not necessary to apply the inducing pulse VLAP. Hence, processing of a memory system 1 moves to processing in steps S10 and S11.

When there is information related to the word line WL in the risk table (step S61, YES), the processor 230 decides whether or not to generate the inducing pulse VLAP according to the information in the risk table (step S62). In this case, the processor 230 first checks whether or not WL leakage has already been detected in the word line WL (step S70). If WL leakage has already been detected (step S70, YES), the processor 230 does not program to the word line and selects another word line WL (step S71). This processing is the same as step S23 described in the first embodiment.

If WL leakage has not yet been detected in the word line WL, the processor 230 decides whether or not to generate the inducing pulse VLAP according to other risk information (step S63). In the above example, if the number of times of writing performed in the past is nine, the writing operation is the tenth writing operation after the latest inducing pulse VLAP is generated, and therefore the processor 230 decides to generate the inducing pulse VLAP (step S63, YES). Further, the processor 230 outputs a command to issue the inducing pulse VLAP, to the NAND flash memory 100 (step S64). Furthermore, the operation moves to processing in steps S10 and S11. In addition, similarly to the third embodiment, that the command to issue the inducing pulse VLAP has been output is recorded as a log in the embedded memory 220.

On the other hand, when deciding that a condition does not correspond to a condition defined in the risk table and deciding not to issue the inducing pulse VLAP (step S63, NO), the processor 230 does not output the command to issue the inducing pulse VLAP, and the operation moves to processing in steps S10 and S11.

After step S11, processing in steps S45 to S47 is performed similarly to the third embodiment. Further, after step S46, the controller 200 issues a status read command, and processing in steps S16 to S18 is performed.

If status information indicates that programming has passed as a reading result of the status information (step S18, YES), the processor 230 checks whether or not the inducing pulse VLAP has been generated before programming (step S65). This step S67 can also be executed by referring to a log in the embedded memory 220 (the same also applies to step S67, too). If the inducing pulse VLAP has not been generated (step S65, NO), the processor 230 performs processing in step S19. If the inducing pulse VLAP has been generated (step S65, YES), the processor 230 updates the risk table (step S66). That is, the processor 230 records in the risk table that WL leakage has occurred in the word line WL. Further, for example, the processor 230 initializes the number of times of programming the word line WL (returns the number of times of programming to zero). Subsequently, the processor 230 performs the processing in step S19.

If the read status information indicates that the programming has failed in step S18 (step S18, NO), the processor 230 checks whether or not the inducing pulse VLAP has been generated before the programming (step S67). If the inducing pulse VLAP has not been generated (step S67, NO), the processor 230 performs the processing in step S22. If the inducing pulse VLAP has been generated (step S67, YES), the processor 230 updates the risk table (step S68). This processing is the same as processing in step S66. Subsequently, the processor 230 performs processing in step S23.

4.3 Effect of Present Embodiment

A NAND flash memory may include word lines which easily cause short-circuiting failure and word lines which are not likely to cause short-circuiting failure.

For example, the word lines WL adjacent to selection gate lines SGD and SGS are more likely to cause short-circuiting failure than other word lines. Further, the word lines WL whose cumulative numbers of times of performed writing operations exceed a certain number of times may cause short-circuiting failure compared to the word lines WL whose number of times is the certain number of times.

In the present embodiment, the word lines WL which are likely to cause short-circuiting failure are registered in the risk table by focusing on the difference in characteristics. Further, when data is written in the registered word line WL, if predetermined conditions (e.g., a frequency to apply an inducing pulse) are satisfied, the controller 200 outputs an inducing pulse issuance command. Further, when the predetermined conditions are not satisfied, and when the word lines WL are not registered in the risk table, the inducing pulse VLAP is not applied.

According to the method of the present embodiment, it is possible to efficiently apply the inducing pulse VLAP only to the necessary word lines WL, similarly to the third embodiment.

In addition, a status read command described in the second embodiment with reference to FIGS. 16 and 17 may be used in the present embodiment, too. Further, in this case, it is possible to decide whether or not WL leakage occurs, based on a flag output from, for example, a voltage generator circuit 180 of the NAND flash memory 100 as described in the second embodiment. Hence, when WL leakage is detected based on this flag, step S32 described with reference to FIGS. 14A and 14B may be executed, and processing in step S46 may be skipped.

Further, only information of word lines which are likely to cause failure may be registered in the risk table. In this case, when there is information related to a programming target word line WL in step S61 in FIG. 21A, the operation moves to processing in step S64 to issue an inducing pulse command.

Naturally, information recorded in the above-described risk table is example information, and is not limited thereto as long as information serves as a decision criterion for applying an inducing pulse.

5. Modified Example

As described above, a semiconductor memory device (NAND flash memory 100) includes: a first string unit (FNG0 in FIG. 2) including first and second memory cell transistors (MT0 and MT1 in FIG. 2); a second string unit (FNG1 in FIG. 2) including third and fourth memory cell transistors (MT0 and MT1 in FIG. 2); a first word line (WL0 in FIG. 2) coupled to gates of the first and third memory cell transistors (MT0 in FIG. 2); and a second word line (WL1 in FIG. 2) which is coupled to gates of the second and fourth memory cell transistors (MT1 in FIG. 2). A data writing operation includes a step-up operation of a voltage (VPGM) of a word line. When the first string unit (FNG0) is selected and the first word line (WLi) is selected, a first voltage (VLAP) is applied to the first word line (WLi) before the step-up operation (FIG. 7). The first voltage (VLAP) is larger than an initial value (VPGM1) of the voltage in the step-up operation (FIG. 7).

Further, a memory system 1 according to the above embodiment includes: a memory including a first memory cell transistor (MT0 in FIG. 2) and a first word line (WL0 in FIG. 2) coupled to a gate of the first memory cell transistor (MT0 in FIG. 2); and a controller controlling the memory. When the controller issues a first command (YYh+80h, FIG. 20), the memory steps up a voltage (VPGM) of the first word line (WLi) after applying a first voltage (VPGM) to the first word line (WLi). When the controller issues a second command (80h) different from the first command, the memory steps up the voltage (VPGM) of the first word line (WLi) without applying the first voltage (VLAP) to the first word line (WLi). The first voltage (VLAP) is larger than the initial value (VPGM1) of the voltage to be stepped up (FIG. 7).

According to the above configuration, in a configuration which shares the word lines WL between a plurality of string units (fingers FNG), the voltage VLAP is applied to the given word line WL before the voltage VPGM is applied when data is written in a string unit to which a first access is made. Thus, it is possible to detect potential word line short-circuiting failure, and prevent written data from being lost.

In addition, the embodiments are not limited to the above described embodiments, and can be variously modified and can be arbitrarily combined and carried out.

For example, each element in a controller 200 may be realized by software to be executed by a processor, by hardware or by a combination thereof.

Further, the order of processing in the flowcharts described in the above embodiments can be permutated as necessary or may be omitted. Further, an example where, when writing data has succeeded in step S18, the controller 200 performs processing of completing the writing operation in step S19 has been described with reference to FIGS. 5A, 5B, 14A, 14B, 19A, 19B, 21A and 21B. However, when write data remains, data may be written in a memory cell transistor MT of the same word line and a different finger FNG, or another word line may be selected to write data therein. Further, when another word line WL is selected, the access target finger FNG is the finger FNG0, the inducing voltage VLAP is applied to the word line.

Furthermore, the above embodiments are not limited to the configuration where memory cells are three-dimensionally stacked. The above embodiments are applicable to, for example, a normal planar type NAND flash memory formed by two-dimensionally aligning the memory cell transistors MT and selection transistors ST on a semiconductor substrate. Further, the above embodiments are applicable not only to NAND flash memories but also generally to memories whose data in a plurality of regions is likely to be lost due to leakage from a line.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
    first and second strings, each of the first and second strings including a plurality of memory cells and a select transistor, the plurality of memory cells being connected in series, the select transistor being electrically connected in series with the plurality of memory cells, the plurality of memory cells including a first memory cell and a second memory cell;
    a bit line electrically connected to the first and the second strings;
    a first select gate line electrically connected to a gate of the select transistor of the first string;
    a second select gate line electrically connected to a gate of the select transistor of the second string;
    a first word line electrically connected to gates of the first memory cell of the first string and the first memory cell of the second string; and
    a second word line electrically connected to gates of the second memory cell of the first string and the second memory cell of the second string,
    wherein a data writing operation includes applying first to n-th (n is an integer of 2 or more) program voltages to a word line and applying first to n-th verify voltage to the word line, the k-th (k is an integer that satisfies 1≤k≤n) verify voltage being applied after the k-th program voltage,
    the (m+1)-th (m is an integer that satisfies 1≤m≤(n−1)) program voltage is larger than the m-th program voltage,
    when the first string is selected and the first word line is selected, a first voltage is applied to the first word line before the first program voltage is applied to the first word line, and
    the first voltage is larger than the first program voltage.

2. The device according to claim 1, wherein
when the first string is selected and the second word line is selected, the first voltage is applied to the second word line before the first program voltage is applied to the second word line, and
when the second string is selected and the second word line is selected, the first voltage is not applied to the second word line before the first program voltage is applied to the second word line.

3. The device according to claim 1,
wherein, when the first voltage is applied to the word line, the bit line and the first and second select gate lines are nonselected.

4. The device according to claim 1, wherein the first voltage is larger than the n-th program voltage.

5. The device according to claim 1, further comprising a circuit detecting short-circuiting between word lines in applying the program voltages,
wherein the circuit compares a reference voltage and a monitor voltage corresponding to the program voltage, and outputs a signal based on a comparison result.

6. The device according to claim 5, wherein, when the signal is not output, the writing operation is stopped.

7. The device according to claim 6, wherein, when the signal is not output, information indicating that a word line to which the program voltage has been applied is bad is transmitted to a controller.

8. The device according to claim 7, wherein the information is transmitted as status information of the semiconductor memory device to the controller in response to a status read command from the controller.

9. The device according to claim 1, wherein
when the second string is selected and the first word line is selected, the first voltage is not applied to the first word line before the first program voltage is applied to the first word line.

10. A memory system comprising:
a memory including a first memory cell transistor and a first word line coupled to a gate of the first memory cell transistor; and
a controller controlling the memory,
wherein when the controller issues a first command, the memory steps up a voltage of the first word line after applying a first voltage to the first word line, and
when the controller issues a second command different from the first command, the memory steps up the voltage of the first word line without applying the first voltage to the first word line, and
wherein the first voltage is larger than an initial value of the voltage to be stepped up.

11. The system according to claim 10, wherein the first voltage is larger than a maximum possible value of the voltage to be stepped up.

12. The system according to claim 10, wherein
the controller holds information indicating whether or not the first voltage has already been applied to the first word line; and
issues both of the first and second commands when the first voltage is not yet applied to the first word line.

13. The system according to claim 12, wherein
the controller holds information related to a result of a past writing operation with respect to the first word line; and
selects a second word line different from the first word line in a case where the first voltage has already been applied to the first word line and the past writing operation has failed.

14. The system according to claim 10, wherein
the controller holds a table in which an applying condition of the first voltage is stored; and
issues the first command when the first word line satisfies the applying condition.

15. The system according to claim 14, wherein
the table includes:
an address of a word line to which the first voltage needs to be applied;
a frequency to apply the first voltage; and
a number of times of writing with respect to the word line corresponding to the address.

16. The system according to claim 10, wherein
the memory further includes:
a second memory cell transistor coupled to the first word line;
a first string unit including the first memory cell transistor; and
a second string unit including the second memory cell transistor, and
the controller, when writing with respect to the first word line in the first string unit is finished, issues a third command to read a status of the memory, and,
when the status indicates that the writing has failed, selects a second word line different from the first word line without performing the writing with respect to the first word line in the second string unit.

17. The system according to claim 16, wherein the controller, when the status indicates that the writing has succeeded, performs the writing operation with respect to the first word line in the second string unit.

18. The system according to claim 10, wherein the memory further includes a circuit detecting short-circuiting between word lines during the stepping up of the voltage of the first word line.

19. The system according to claim 18, wherein the circuit compares a reference voltage and a monitor voltage corresponding to the voltage to be applied to the first word line, and outputs a signal based on a comparison result, and,
when the signal is not output, stops a writing operation.

20. The system according to claim 19, wherein, when the signal is not output, information indicating that a word line to which the voltage has been applied is bad is transmitted to the controller.

* * * * *